(12) United States Patent
Hosoya et al.

(10) Patent No.: US 9,006,050 B2
(45) Date of Patent: Apr. 14, 2015

(54) SEMICONDUCTOR DEVICE AND METHOD FOR MANUFACTURING SEMICONDUCTOR DEVICE

(75) Inventors: Kunio Hosoya, Kanagawa (JP); Saishi Fujikawa, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 13/398,883

(22) Filed: Feb. 17, 2012

(65) Prior Publication Data

US 2012/0149157 A1      Jun. 14, 2012

Related U.S. Application Data

(62) Division of application No. 12/254,603, filed on Oct. 20, 2008, now Pat. No. 8,148,730.

(30) Foreign Application Priority Data

Oct. 23, 2007   (JP) .................. 2007-275612

(51) Int. Cl.
*H01L 21/00*   (2006.01)
*H01L 21/84*   (2006.01)
(Continued)

(52) U.S. Cl.
CPC ...... *H01L 29/78678* (2013.01); *H01L 27/1214* (2013.01); *H01L 29/41733* (2013.01); *H01L 29/66765* (2013.01); *H01L 29/78609* (2013.01)

(58) Field of Classification Search
CPC ..................... H01L 29/78678; H01L 27/1255; H01L 27/1251
USPC .......... 438/158, 164, 149, 151; 257/E21.411, 257/E21.414
See application file for complete search history.

(56) References Cited

U.S. PATENT DOCUMENTS

| 4,409,134 A | 10/1983 | Yamazaki |
| RE34,658 E | 7/1994 | Yamazaki et al. |

(Continued)

FOREIGN PATENT DOCUMENTS

| CN | 1949511 A | 4/2007 |
| JP | 61-203484 A | 9/1986 |

(Continued)

OTHER PUBLICATIONS

Office Action, Chinese Application No. 200810175027.9, dated Jul. 16, 2012, 19 pages with full English translation.

(Continued)

*Primary Examiner* — William F Kraig
*Assistant Examiner* — Latanya N Crawford
(74) *Attorney, Agent, or Firm* — Fish & Richardson P.C.

(57) ABSTRACT

A first resist pattern is formed by exposure using a first multi-tone photomask, and a first conductive layer, a first insulating layer, a first semiconductor layer, and a second semiconductor layer are etched, so that an island-shaped single layer and an island-shaped stack are formed. Here, sidewalls are formed on side surfaces of the island-shaped single layer and the island-shaped stack. Further, a second resist pattern is formed by exposure using a second multi-tone photomask, and a second conductive layer and the second semiconductor layer are etched, so that a thin film transistor, a pixel electrode, and a connection terminal are formed. After that, a third resist pattern is formed by exposure from a rear side using metal layers of the first conductive layer and the second conductive layer as masks, and the third insulating layer are etched, so that a protective insulating layer is formed.

18 Claims, 14 Drawing Sheets

(51) Int. Cl.
*H01L 29/786* (2006.01)
*H01L 27/12* (2006.01)
*H01L 29/417* (2006.01)
*H01L 29/66* (2006.01)

(56) References Cited

U.S. PATENT DOCUMENTS

| | | | |
|---|---|---|---|
| 5,773,331 A * | 6/1998 | Solomon et al. | 438/164 |
| 6,008,065 A | 12/1999 | Lee et al. | |
| 6,184,069 B1 * | 2/2001 | Wu | 438/155 |
| 6,485,997 B2 | 11/2002 | Lee et al. | |
| 6,493,048 B1 | 12/2002 | Baek et al. | |
| 6,509,215 B2 | 1/2003 | Fujikawa et al. | |
| 6,562,645 B2 | 5/2003 | Sung et al. | |
| 6,623,653 B2 | 9/2003 | Furuta et al. | |
| 6,630,687 B1 | 10/2003 | Koyama et al. | |
| 6,635,581 B2 | 10/2003 | Wong | |
| 6,762,082 B2 | 7/2004 | Yamazaki et al. | |
| 6,806,495 B1 | 10/2004 | Yamazaki et al. | |
| 7,023,021 B2 | 4/2006 | Yamazaki et al. | |
| 7,223,643 B2 | 5/2007 | Ohnuma et al. | |
| 7,315,344 B2 | 1/2008 | Lim | |
| 7,381,597 B2 | 6/2008 | Lin | |
| 7,413,940 B2 | 8/2008 | Lin | |
| 7,550,767 B2 | 6/2009 | Yang et al. | |
| 7,588,970 B2 | 9/2009 | Ohnuma et al. | |
| 7,608,490 B2 | 10/2009 | Yamazaki et al. | |
| 7,705,354 B2 | 4/2010 | Yamazaki et al. | |
| 7,763,481 B2 * | 7/2010 | Yang et al. | 438/30 |
| 7,776,664 B2 | 8/2010 | Fujikawa et al. | |
| 7,807,516 B2 | 10/2010 | Ohnuma et al. | |
| 7,816,193 B2 * | 10/2010 | Lin | 438/158 |
| 7,821,613 B2 | 10/2010 | Kimura | |
| 7,824,939 B2 | 11/2010 | Hosoya et al. | |
| 7,842,528 B2 | 11/2010 | Fujikawa et al. | |
| 7,973,312 B2 | 7/2011 | Yamazaki et al. | |
| 8,149,346 B2 | 4/2012 | Kimura | |
| 8,188,478 B2 | 5/2012 | Yamazaki et al. | |
| 2003/0013236 A1 | 1/2003 | Nakata et al. | |
| 2003/0017636 A1 | 1/2003 | Lay et al. | |
| 2004/0063254 A1 * | 4/2004 | Wang et al. | 438/149 |
| 2004/0125313 A1 * | 7/2004 | Lim | 349/152 |
| 2005/0101071 A1 * | 5/2005 | Wang | 438/151 |
| 2005/0157236 A1 * | 7/2005 | Kawasaki | 349/139 |
| 2005/0237465 A1 | 10/2005 | Lu et al. | |
| 2005/0263768 A1 | 12/2005 | Ahn | |
| 2005/0270434 A1 | 12/2005 | Jung et al. | |
| 2006/0097260 A1 | 5/2006 | Huang | |
| 2006/0138429 A1 * | 6/2006 | Heo | 257/72 |
| 2006/0290867 A1 | 12/2006 | Ahn et al. | |
| 2007/0002249 A1 | 1/2007 | Yoo et al. | |
| 2007/0023790 A1 | 2/2007 | Ohnuma et al. | |
| 2007/0037070 A1 | 2/2007 | Ohnuma et al. | |
| 2007/0052043 A1 | 3/2007 | Cha et al. | |
| 2007/0052907 A1 | 3/2007 | Yamazaki et al. | |
| 2007/0077692 A1 | 4/2007 | Yang et al. | |
| 2007/0085475 A1 | 4/2007 | Kuwabara et al. | |
| 2007/0121372 A1 * | 5/2007 | Iwata et al. | 365/154 |
| 2007/0126969 A1 | 6/2007 | Kimura et al. | |
| 2007/0139571 A1 | 6/2007 | Kimura | |
| 2007/0146591 A1 | 6/2007 | Kimura et al. | |
| 2007/0222936 A1 | 9/2007 | Shih | |
| 2007/0269937 A1 * | 11/2007 | Lin | 438/149 |
| 2008/0061295 A1 | 3/2008 | Wang et al. | |
| 2008/0224139 A1 | 9/2008 | Lai et al. | |
| 2008/0237596 A1 | 10/2008 | Kim et al. | |
| 2009/0108260 A1 | 4/2009 | Lin et al. | |
| 2009/0148970 A1 | 6/2009 | Hosoya et al. | |
| 2009/0261334 A1 | 10/2009 | Ahn | |
| 2012/0170784 A1 | 7/2012 | Kimura | |
| 2012/0229725 A1 | 9/2012 | Yamazaki et al. | |

FOREIGN PATENT DOCUMENTS

| | | | |
|---|---|---|---|
| JP | 03-011744 A | | 1/1991 |
| JP | 09092838 A | | 4/1997 |
| JP | 2002333845 A | | 11/2002 |
| JP | 2003-179069 A | | 6/2003 |
| JP | 2003-234355 A | | 8/2003 |
| JP | 2007-133371 A | | 5/2007 |
| JP | 2007189120 A | | 7/2007 |
| JP | 2007212699 A | * | 8/2007 |
| KR | 2007-0036510 A | | 4/2007 |
| KR | 2007-0103326 A | | 10/2007 |

OTHER PUBLICATIONS

C.W. Kim et al.; "42.1: A Novel Four-Mask-Count Process Architecture for TFT-LCDs"; SID Digest '00 : SID International Symposium Digest of Technical Papers; pp. 1006-1009; 2000.

Chinese Office Action (Application No. 200810175027.9) dated Jul. 18, 2013, with Full English Translation.

* cited by examiner

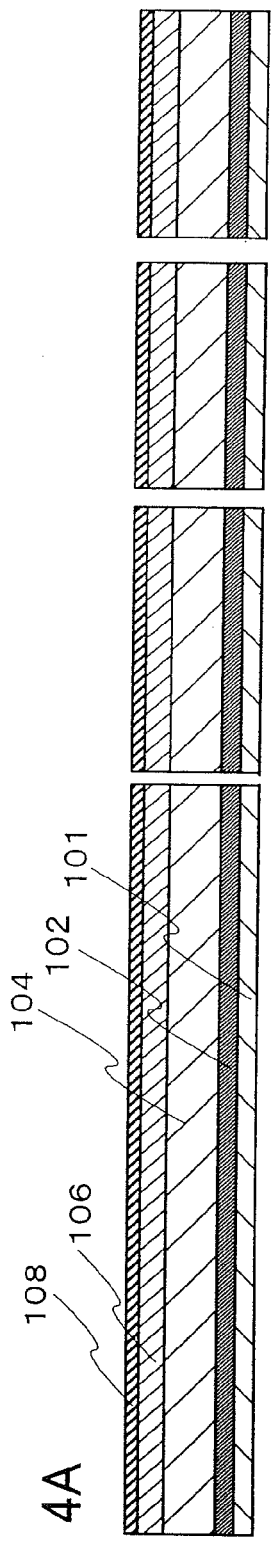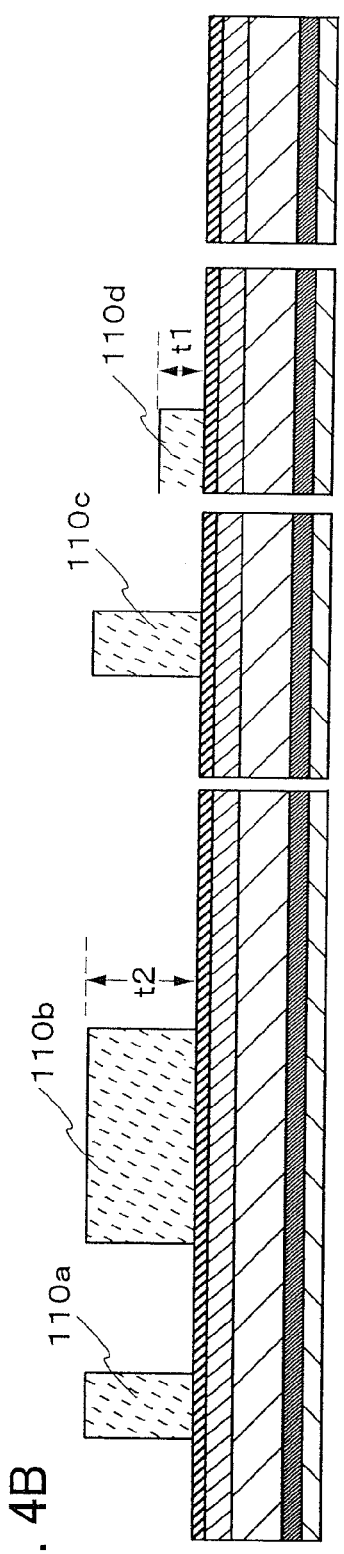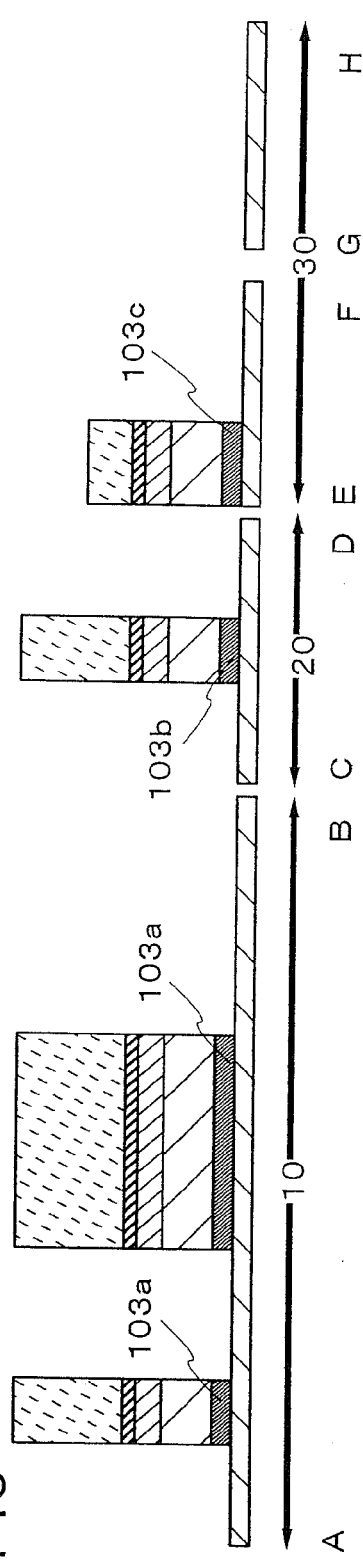

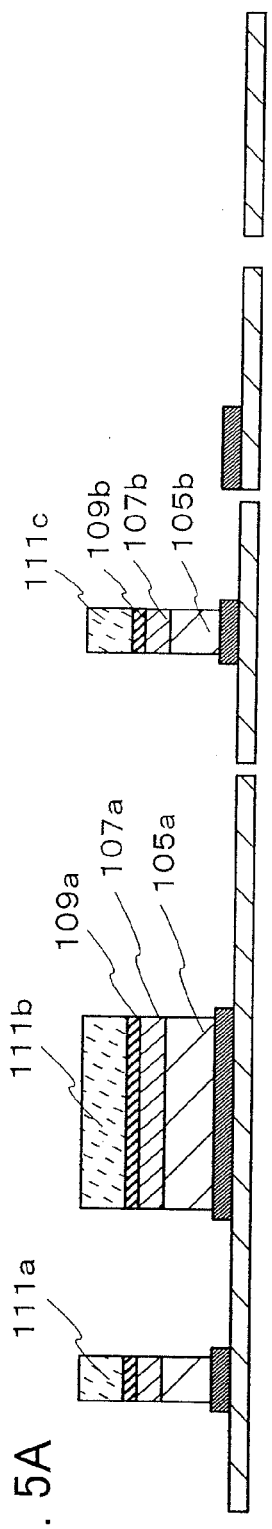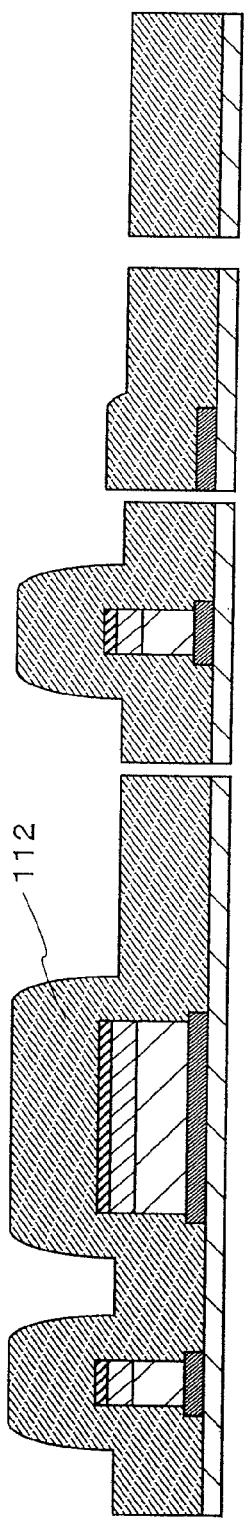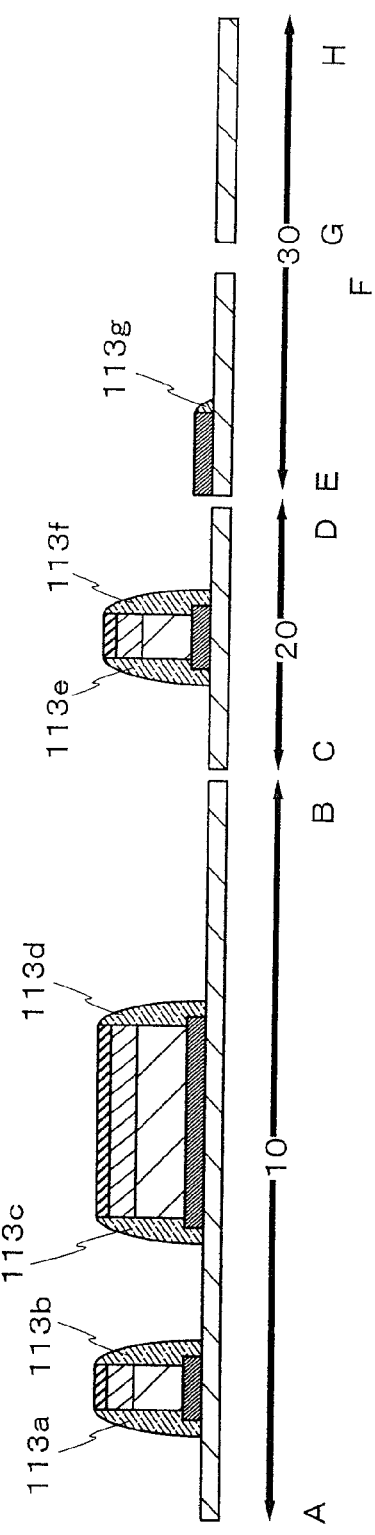

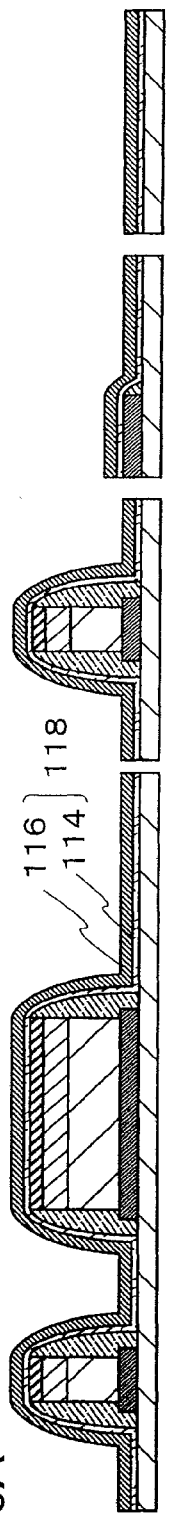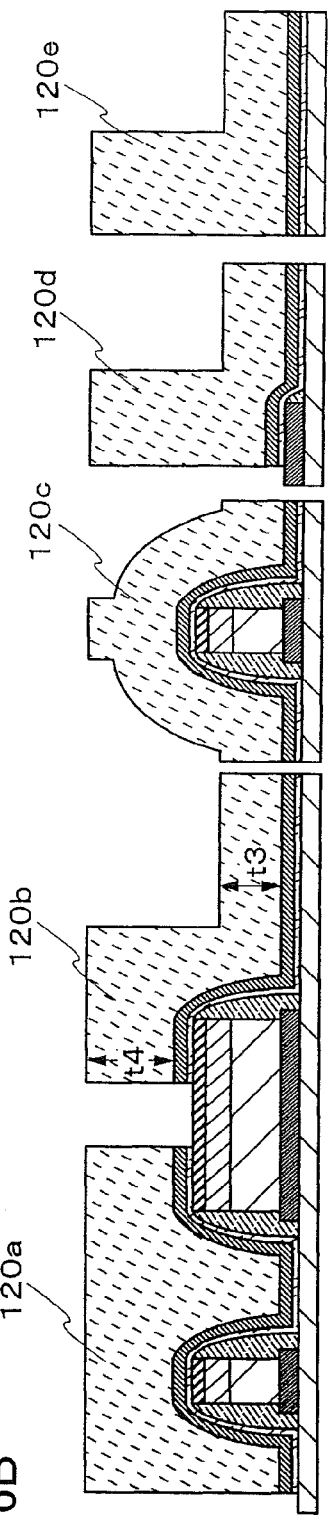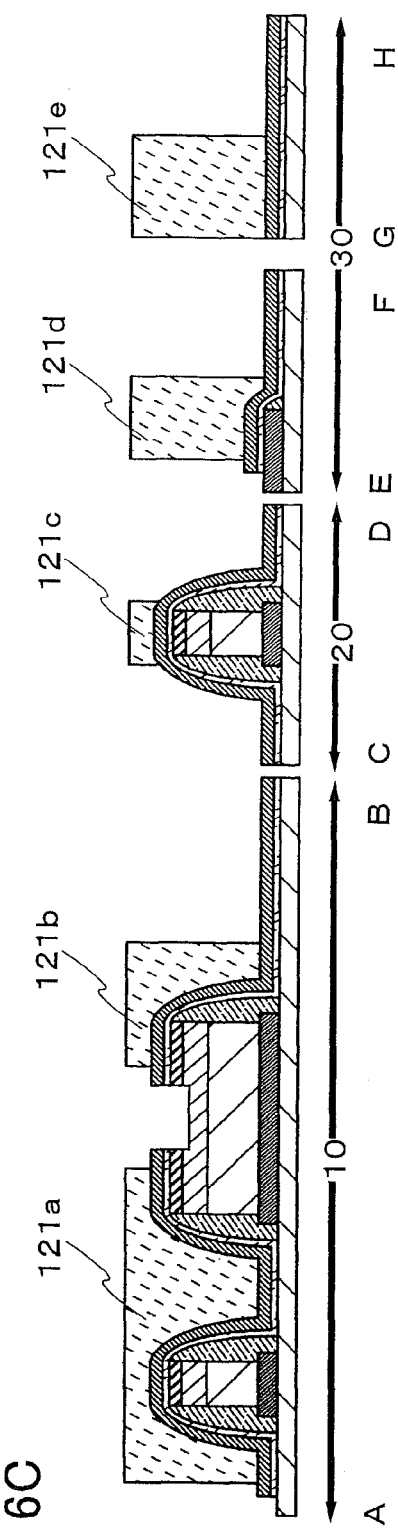

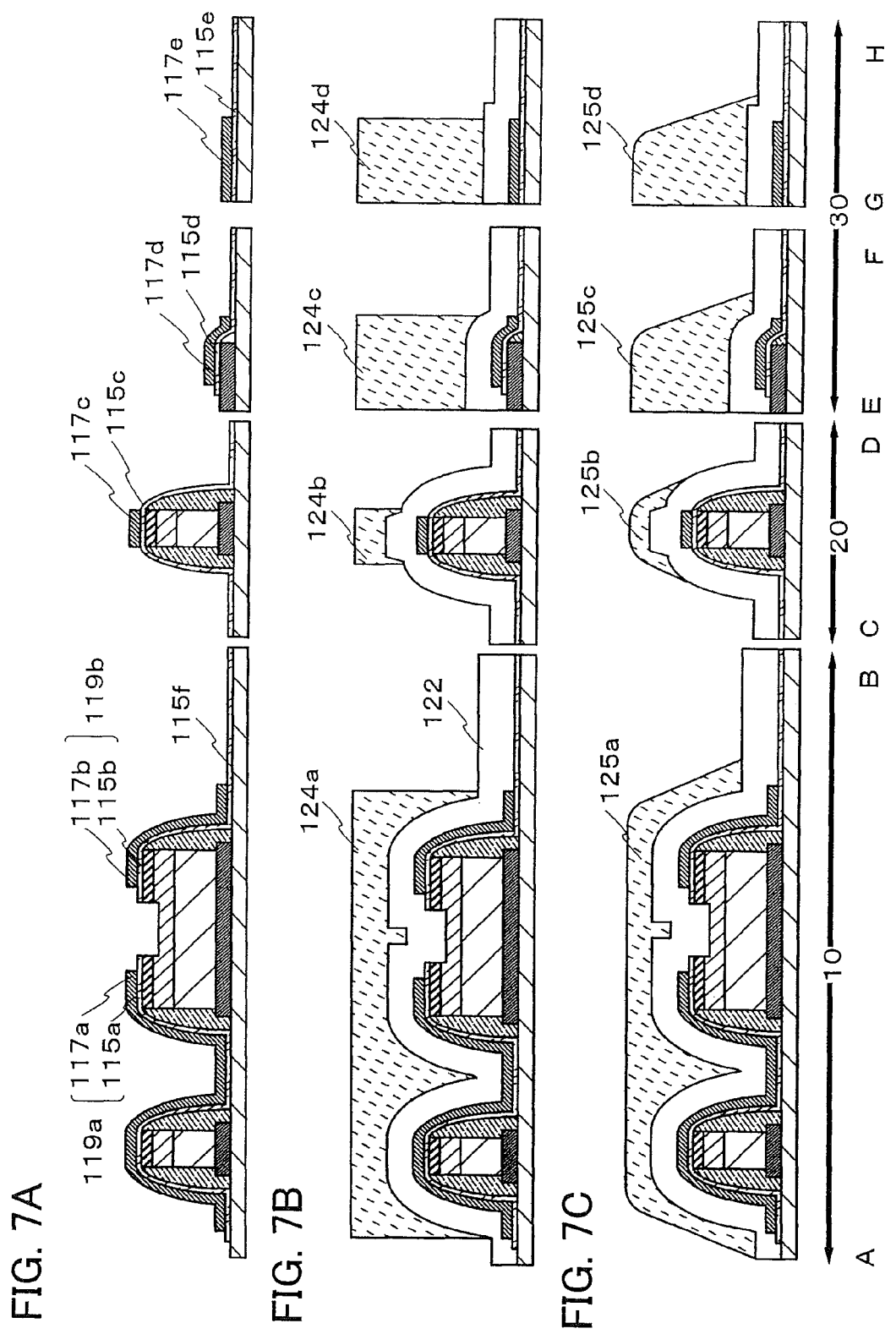

SEMICONDUCTOR DEVICE AND METHOD FOR MANUFACTURING SEMICONDUCTOR DEVICE

CROSS-REFERENCE TO RELATED APPLICATIONS

This application is a divisional of U.S. application Ser. No. 12/254,603, filed Oct. 20, 2008, now allowed, which claims the benefit of a foreign priority application filed in Japan as Serial No. 2007-275612 on Oct. 23, 2007, both of which are incorporated by reference.

BACKGROUND OF THE INVENTION

1. Field of the Invention

The present invention relates to a semiconductor device which has a circuit including a thin film transistor (hereinafter referred to as a TFT) and a method for manufacturing the semiconductor device. For example, the present invention relates to electro-optic devices typified by display devices using a liquid crystal element or a light emitting element, and to electronic devices mounted with those electro-optic devices as a component.

Note that a semiconductor device in this specification refers to all electrical devices which can function by utilizing semiconductor characteristics, and electro-optical devices, semiconductor circuits, and electronic appliances are all semiconductor devices.

2. Description of the Related Art

Most of display devices such as display of liquid crystal televisions, personal computers, and cellular phones that are widely available use liquid crystal display devices utilizing TFTs using amorphous semiconductor including silicon as a main structural element for a switching element. A TFT using an amorphous semiconductor (hereinafter, referred to as an amorphous semiconductor TFT) is conventionally formed to have a layered structure by a photolithography process using five photomasks. Further, in recent years, using multi-tone photomasks, a process of manufacturing amorphous semiconductor TFTs using photomasks, the number of which is reduced to four has been developed.

SUMMARY OF THE INVENTION

In this specification, a "photolithography process" refers to a process including steps of formation of a photoresist, exposure, development, etching, resist removal, cleaning treatment, inspection, and/or the like. Further, in this specification, "patterning" refers to removing unnecessary part of a layer formed over a substrate to process it into a desired shape. For example, a process of removing unnecessary part of an insulating layer, a conductive layer, a semiconductor layer, and/or the like which are formed over a substrate, and processing them into a desired shape is referred to as patterning.

Therefore, in the case of manufacturing an amorphous semiconductor TFT using conventional five masks, a photolithography process is to be repeated five times. A photolithography process having a plurality of steps of exposure, development, and the like have become a factor greatly affecting decrease in throughput and increase in manufacturing cost of a manufacturing process of amorphous semiconductor TFTs.

Accordingly, reduction in the number of photolithography processes due to reduction in the number of photomasks means improvement in throughput or reduction in manufacturing cost of a process of manufacturing amorphous semiconductor TFTs. Therefore, reduction in the number of photomasks is a significant challenge for producing semiconductor devices using lower cost amorphous semiconductor TFTs.

In recent years, in view of reducing the number of steps in a process of manufacturing amorphous semiconductor TFTs, a manner in which patterning of an amorphous semiconductor layer and patterning of a source/drain electrode are performed using one multi-tone photomask (a gray tone mask or a half tone mask) has been proposed; however, even when this manner is used, the number of photomasks can be only reduced to four. Since less expensive semiconductor devices, for example, liquid crystal display devices are requested, reduction in manufacturing cost by reducing the number of steps of a process of manufacturing amorphous semiconductor TFTs is a significant subject.

In addition, since a conventional process of manufacturing amorphous semiconductor TFTs requires photomasks, the number of which is equivalent to the number of the steps of the photolithography process, cost of designing photomasks is a factor significantly causing increase in manufacturing cost of amorphous semiconductor TFTs. Therefore, it is another great subject to reduce photomask design cost by reducing the number of photomasks.

Further, in a pixel using a conventional amorphous semiconductor TFT, there is an interlayer insulating film between a source/drain electrode and a pixel electrode. Therefore, it has been necessary to form a contact hole for electrically connecting the source/drain electrode and the pixel electrode in the pixel, and to ensure space for the contact hole formation region. The contact hole formation region formed in the pixel has been a factor of reduction in aperture ratio of the pixel. Reference 1 (Japanese Published Patent Application No. 2007-133371) discloses a connection structure of a source/drain electrode and a pixel electrode without a contact hole, in which an interlayer insulating film between a pixel electrode and a source/drain electrode is omitted, and direct connection is made.

Since a pixel using a conventional amorphous semiconductor TFT has a structure in which a pixel electrode and an insulating layer are stacked, which has led to decrease in transmittance through pixels.

The present invention was made in view of the above problems, and it is an object to provide a semiconductor device provided with pixels with improved aperture ratio and transmittance, or a method for manufacturing a semiconductor device at lower cost.

It is an aspect of the present invention that, in a semiconductor device having a semiconductor element over a substrate, the semiconductor element includes an island-shaped stack including a first conductive layer over the substrate, a first insulating layer over the first conductive layer, a first semiconductor layer over the first insulating layer, and a second semiconductor layer containing an impurity element having one conductivity type over the first semiconductor layer; and a sidewall in contact with a side surface of the island-shaped stack.

It is an aspect of the present invention that, in a semiconductor device having a pixel including a thin film transistor and a capacitor element over a substrate, the capacitor element includes an island-shaped stack including a first conductive layer over the substrate, a first insulating layer over the first conductive layer, a first semiconductor layer over the first insulating layer, and a second semiconductor layer containing an impurity element having one conductivity type over the first semiconductor layer; a sidewall in contact with a side surface of the island-shaped stack; and a second conductive layer over the island-shaped stack and the sidewall.

It is an aspect of the present invention that, in a semiconductor device having a pixel including a TFT and a capacitor element over a substrate, the TFT includes an island-shaped stack including a first conductive layer over the substrate, a first insulating layer over the first conductive layer, a first semiconductor layer over the first insulating layer, and a second semiconductor layer containing an impurity element having one conductivity type over the first semiconductor layer; a sidewall in contact with a side surface of the island-shaped stack; and a second conductive layer over the island-shaped stack and the sidewall. Further, the second conductive layer has a layered structure including at least a transparent conductive layer, part of the transparent conductive layer is a pixel electrode, and the pixel electrode is in contact with the substrate.

Note that an amorphous semiconductor layer or a microcrystalline semiconductor layer can be applied as the first semiconductor layer and the second semiconductor layer. Further, a stack of a microcrystalline semiconductor layer and an amorphous semiconductor layer can be applied as the first semiconductor layer.

It is an aspect of the present invention that, in a semiconductor device having a pixel including a TFT and a capacitor element, and a connection terminal over a substrate, the connection terminal includes an island-shaped single layer having a first conductive layer over the substrate; a sidewall in contact with a side surface of the island-shaped single layer; and a second conductive layer over the island-shaped single layer and the sidewall. Further, the second conductive layer has a layered structure including at least a transparent conductive layer.

Hereinafter, a method of manufacturing an active matrix substrate having the above-described TFT, a capacitor element, and a connection terminal over one substrate will be briefly described.

In FIG. 4A, a first conductive layer 102 is formed over a substrate 101.

Next, a first insulating layer 104 is formed over the first conductive layer 102, a first amorphous semiconductor layer 106 over the first insulating layer 104, and a second amorphous semiconductor layer containing an impurity element having one conductivity type 108 is formed over the first amorphous semiconductor layer 106.

Next, the first conductive layer 102, the first insulating layer 104, the first amorphous semiconductor layer 106, and the second amorphous semiconductor layer containing an impurity element having one conductivity type 108 are patterned by a first photolithography process.

In FIG. 4B, a photoresist is formed over the second amorphous semiconductor layer containing an impurity element having one conductivity type, and is exposed using a first photomask, and development is performed to form first photoresist patterns 110a to 110d. Here, a multi-tone photomask (gray tone mask or half tone mask) is used as the first photomask to form a photoresist pattern having variation in film thickness. The thickness of a portion of the photoresist pattern, where an island-shaped single layer formed only of the first conductive layer 102 is formed is set at a first thickness (t1), and the thickness of a portion of the photoresist pattern, where an island-shaped stack formed of the first conductive layer 102, the first insulating layer 104, the first amorphous semiconductor layer 106, and the second amorphous semiconductor layer containing an impurity element having one conductivity type 108 is formed is set at a second thickness (t2). Here, the first thickness of the photoresist pattern is smaller than the second thickness thereof (t1<t2).

In FIG. 4C, the first conductive layer 102, the first insulating layer 104, the first amorphous semiconductor layer 106, and the second amorphous semiconductor layer containing an impurity element having one conductivity type 108 are etched using the first photoresist patterns 110a to 110d as masks to form an island-shaped single layer and island-shaped stacks.

In FIG. 5A, the first photoresist patterns 110a to 110d are treated by ashing thereby forming deformed first photoresist patterns 111a to 111c and removing the photoresist pattern 110d. As shown in FIG. 5A, parts of the first photoresist patterns 111a to 111c, which have a thickness corresponding to the first thickness (t1) of the first photoresist patterns 110a to 110c are removed, so that the thickness of the first photoresist patterns 111a to 111c is reduced. In addition, when the first photoresist patterns 110a to 110d are subjected to ashing treatment, the side surfaces of the first photoresist patterns 110a to 110d are also subjected to ashing, the area of the first photoresist patterns 111a to 111c becomes slightly smaller than the area of the photoresist patterns having the second thickness (t2) which are formed in the step of FIG. 4B, and although not shown, an end portion of the second amorphous semiconductor layer containing an impurity element having one conductivity type is to be exposed at the surface.

An island-shaped gate insulating layer 105a and the like formed of the first insulating layer 104, an island-shaped first amorphous semiconductor layer 107a and the like formed of the first amorphous semiconductor layer 106, and an island-shaped second amorphous semiconductor layer containing an impurity element having one conductivity type 109a and the like formed of a second amorphous semiconductor layer containing an impurity element having one conductivity type 108 are formed by etching using the deformed first photoresist patterns 111a to 111c as masks. After that, the photoresist patterns 111a to 111c are removed.

In the first photolithography process, a multi-tone photomask is used as a first photomask to form a gate wiring 103a, the gate insulating layer 105a, the island-shaped first amorphous semiconductor layer 107a, and the island-shaped second amorphous semiconductor layer containing an impurity element having one conductivity type 109a are Ruined in a TFT area 10. Further, a capacitor line 103b, an insulating layer 105b, an island-shaped first amorphous semiconductor layer 107b, an island-shaped second amorphous semiconductor layer containing an impurity element having one conductivity type 109b are formed in the capacitor portion 20, and an electrode 103c is formed in a terminal area 30 (FIGS. 4B and 4C and FIG. 5A).

In FIG. 5B, a second insulating layer 112 is formed over the entire surface of the substrate. The second insulating layer 112 is used for forming sidewalls on the side surfaces of a pattern of in which a first conductive layer exists as a single layer and a pattern in which a first conductive layer, a first insulating layer, a first amorphous semiconductor layer, and a second amorphous semiconductor layer containing an impurity element having one conductivity type remain in a stacked island structure, which are formed by an exposure technique using a multi-tone photomask in the first photolithography process. If the side surfaces of the patterns are tapered, unnecessary short easily occurs between a first conductive layer and a second conductive layer even when sidewalls are formed, which would impair reliability of a semiconductor element. Therefore, in order to use the second insulating layer 112 as a sidewall, it is important that the second insulating layer 112 has good coverage over a stepped portion.

In FIG. 5C, the second insulating layer 112 is etched to form sidewalls 113a to 113g. Highly anisotropic etching treatment is required to be performed by dry etching or the like to form the sidewalls 113a to 113g. Further, when the second insulating layer 112 is subjected to etching, it is required to have sufficient selectivity over the island-shaped second amorphous semiconductor layers containing an impurity element having one conductivity type 109a and 109b, and in the case where the second amorphous semiconductor layer containing an impurity element having one conductivity type 108 is slightly etched, it is necessary to set a larger thickness correspondingly in view of the etching.

In FIG. 6A, a second conductive layer 118 is formed over the entire surface of the substrate. The second conductive layer 118 has a structure in which a transparent conductive layer 114 and a metal layer 116 are sequentially stacked.

Next, the second conductive layer 118 formed of the transparent conductive layer 114 and the metal layer 116 is patterned by a second photolithography process.

In FIG. 6B, a photoresist is formed over the second conductive layer, and is exposed using a second photomask, and development is performed to form second photoresist patterns 120a to 120e. Here, a multi-tone photomask is used as the second photomask as with the first photomask; thus, a photoresist pattern having variation in film thickness is formed. The thickness of a portion of the photoresist pattern, where the second conductive layer 118 which is a stack of the transparent conductive layer 114 and the metal layer 116 remain is set at fourth thickness (t4), and the thickness of a portion of the photoresist pattern, where only the transparent conductive layer 114 is left is set at third thickness (t3). The third thickness (t3) is smaller than the fourth thickness (t4) (t3<t4). The second conductive layer 118 is etched using the second photoresist patterns 120a to 120e as masks. Wet etching or dry etching can be used as an etching method at this time.

In FIG. 6C, the second photoresist patterns 120a to 120e are treated by asking thereby forming deformed second photoresist patterns 121a to 121e. As shown in FIG. 6C, parts of the second photoresist patterns 121a to 121e, which have a thickness corresponding to the third thickness (t3) of the second photoresist patterns 120a to 120e are removed, so that the thickness of the second photoresist patterns 121a to 121e is reduced, and the metal layer 116 in a part of the second photoresist pattern, whose original thickness is the third thickness (t3) is to be exposed. In addition, when asking treatment is performed, the side surfaces of the second photoresist patterns 120a to 120e are also subjected to asking, the area of the deformed second photoresist patterns 121a to 121e becomes slightly smaller than the area of the photoresist patterns having the fourth thickness (t4) which are formed in the step of FIG. 6B.

In FIG. 7A, the metal layer 116 exposed at the surface is removed by etching using the deformed second photoresist patterns 121a to 121e as masks to expose the transparent conductive layer 114 at the surface. Here, etching is performed by a method capable of achieving sufficient selectivity between the metal layer and the transparent conductive layer. The exposed transparent conductive layer 114 is used as a pixel electrode or a connection terminal on the edge of the substrate. Further, a central part of the island-shaped second amorphous semiconductor layer containing an impurity element having one conductivity type 109a is etched to be divided into a source region and a drain region. This etching is performed by anisotropic dry etching method. Actually, the island-shaped first amorphous semiconductor layer 107a is also etched in a measure.

In the second photolithography process, a multi-tone photomask is used as the second photomask to form a source wiring 119a formed of a stack of a transparent conductive layer 115a and a metal layer 117a, and a source or drain electrode 119b formed of a transparent conductive layer 115b and a metal layer 117b in the TFT area 10. Further, part of the transparent conductive layer 115b constitutes a pixel electrode 115f. Still further, an electrode 115c which is a part of the transparent electrode layer 115b, which opposes the capacitor line 103b is formed in a capacitor portion 20, and electrodes 115d and 115e are formed in a terminal area 30 (FIGS. 6B and 6C and FIG. 7A).

In FIG. 7B, a third insulating layer 122 is formed over the entire surface of the substrate. The third insulating layer 122 is used as a protective insulating layer (passivation film) for protecting TFTs from impurities and the like.

Next, as a third photolithography process, a photoresist is formed over the third insulating layer 122, and exposure is performed from the rear surface of the substrate 101. Here, the first conductive layer patterned by the first photolithography process and the metal layer patterned by the second photolithography process are used as masks to form third photoresist patterns 124a to 124d. When the third photoresist patterns are formed, since exposure is performed using patterns of the metal layer 116 which is the upper layer of the first conductive layer 102 and the second conductive layer 118 formed over the substrate 101 as masks, photomasks for the third photoresist patterns are rendered unnecessary, and alignment of photomasks and the substrate 101 also becomes unnecessary.

In FIG. 7C, a reflow process is performed on the third photoresist patterns 124a to 124d formed in FIG. 7B to form deformed third photoresist patterns 125a to 125d. The reflow process increases the area of the third insulating layer 122, which is covered by the resist pattern, and end portions of the deformed third photoresist patterns 125a to 125d extend end portions of the patterns formed of the metal layer 116.

In FIG. 8, the third insulating layer 122 is patterned using the deformed third photoresist patterns 125a to 125d as masks to form the protective insulating layers 123a to 123d.

In the third photolithography process, a back exposure (or rear surface exposure) technique is used to form protective insulating layers 123a to 123d (FIGS. 7B and 7C and FIG. 8)

With such a structure, an active matrix substrate can be manufactured by three photolithography processes using two photomasks. Accordingly, as compared with an amorphous semiconductor TFT conventionally manufactured by at least four times of photolithography processes using four photomasks, the number of photomasks and the number of photolithography processes can be significantly reduced, and time of manufacture and manufacturing cost can be reduced.

In accordance with the present invention, an active matrix substrate can be manufactured by three photolithography processes using two photomasks. Accordingly, as compared with an amorphous semiconductor TFT conventionally manufactured by at least four times of photolithography processes using four photomasks, the number of photomasks and the number of photolithography processes can be significantly reduced, and time of manufacture and manufacturing cost can be reduced.

In accordance with the present invention, a source/drain electrode and a source/drain wiring are formed using a second conductive layer having a layered structure of a transparent conductive layer and a metal layer; therefore, a region where contact holes for a source/drain electrode and a pixel electrode, which is conventionally in a pixel portion is not required; therefore, aperture ratio can be improved. Further, with such a structure that a pixel electrode is in contact with a substrate and is not stacked with an insulating film, aperture ratio and transmittance of pixels are improved.

BRIEF DESCRIPTION OF THE DRAWINGS

FIGS. 4A to 4C are cross-sectional views illustrating a manufacturing process of an active matrix substrate in accordance with the present invention;

FIGS. 5A to 5C are cross-sectional views illustrating a manufacturing process of an active matrix substrate in accordance with the present invention;

FIGS. 6A to 6C are cross-sectional views illustrating a manufacturing process of an active matrix substrate in accordance with the present invention;

FIGS. 7A to 7C are cross-sectional views illustrating a manufacturing process of an active matrix substrate in accordance with the present invention;

DETAILED DESCRIPTION OF THE INVENTION

Hereinafter, the embodiment modes will be described with reference to the drawings. Note that the present invention can be implemented in many different modes and it will be readily appreciated by those skilled in the art that the modes and details can be changed in various ways without departing from the scope and spirit of the present invention. Therefore, the present invention should not be construed as being limited to the description of the embodiment modes.

Embodiment Mode 1

Figure 1:
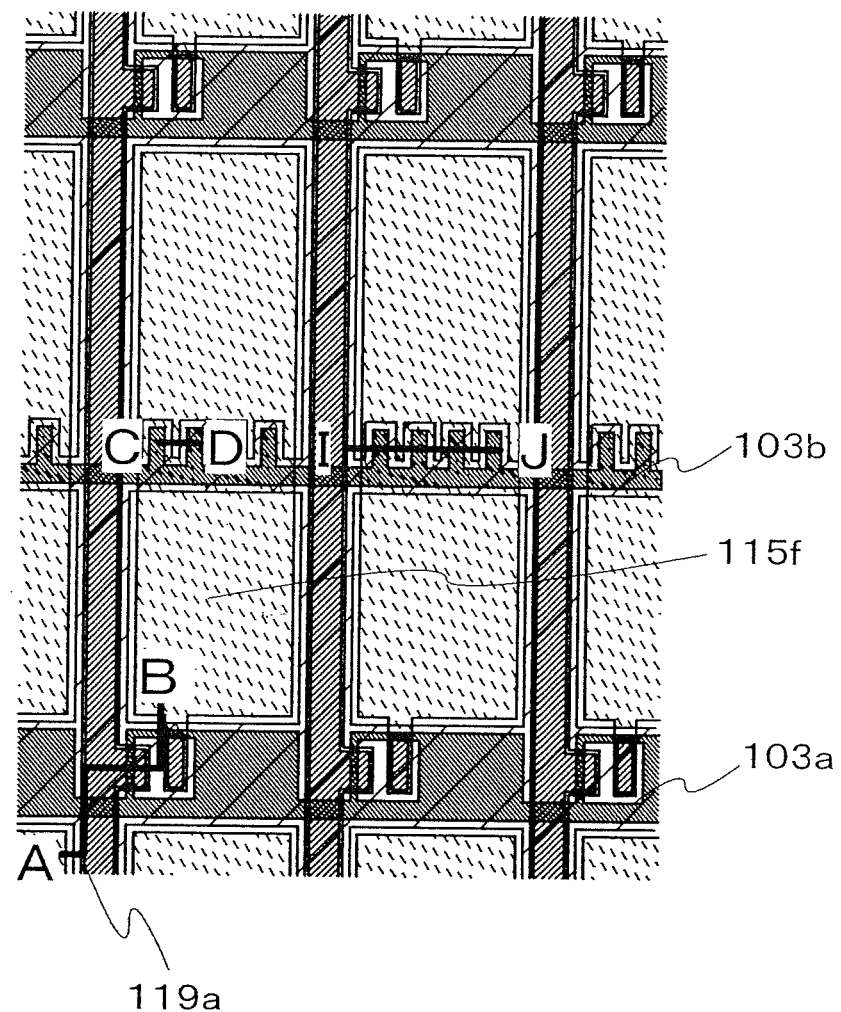
FIG. 1 is a top view illustrating pixels of the present invention.

FIG. 1 is a plan view illustrating an example of an active matrix substrate having amorphous semiconductor TFTs of the present invention; here, the structure of one pixel among a plurality of pixels arranged in matrix is shown for simplicity.

As shown in FIG. 1, an active matrix substrate having amorphous semiconductor TFTs has a plurality of gate wirings 103a which are arranged in parallel to each other, and source wirings 119a arranged in parallel to each other, which are arranged perpendicularly to the gate wirings 103a.

Further, the pixel electrode 115f is placed in a region surrounded by the gate wiring 103a and the source wiring 119a.

The pixel electrode 115f is formed of the same material as the transparent conductive layer 115b of the source/drain electrode 119b.

Further, a capacitor line 103b is provided between two adjacent gate wirings below the pixel electrode 115f, in parallel with the gate wirings. The capacitor line 103b is provided in every pixel, and it forms a storage capacitor element with the pixel electrode 115f using the insulating layer 105b therebetween as a dielectric.

Further, a TFT is provided as a switching element in the vicinity of the intersection between the gate wiring 103a and the source wiring 119a. The TFT is an inverted staggered (or bottom-gate type) TFT having a channel formation region formed of an amorphous semiconductor layer.

Figure 3:
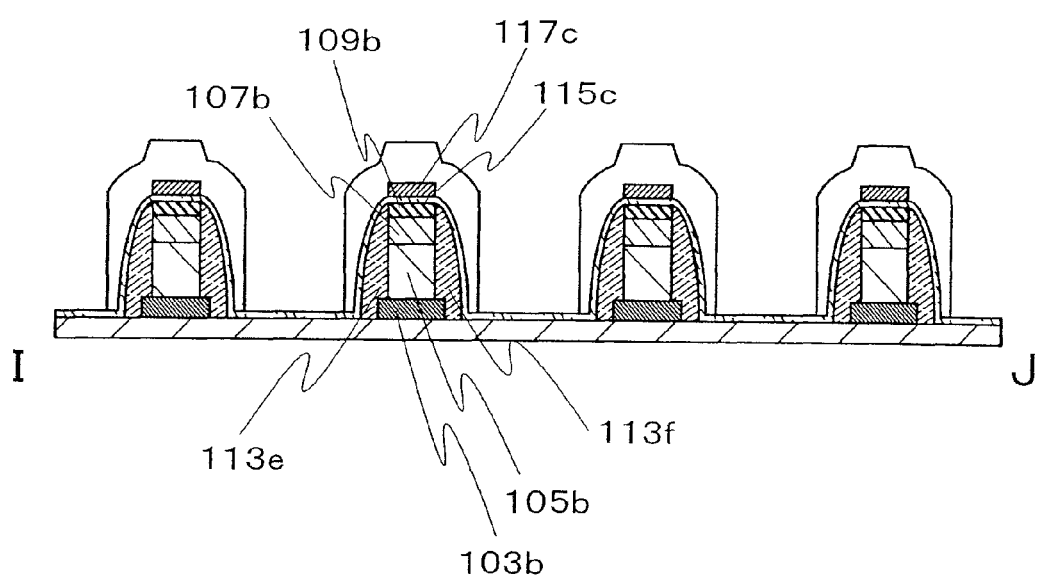
FIG. 3 is a cross-sectional view illustrating a capacitor portion of the present invention.

FIG. 3 is a cross-sectional view of a storage capacitor element formation portion in a pixel portion, taken along line I-J in FIG. 1. In the storage capacitor element, parts of the capacitor line 103b and the pixel electrode 115f are used as electrodes, and a sidewall (side wall) and the insulating layer 105b between the capacitor line 103b and the pixel electrode 115f are used as dielectric films. In FIGS. 1 and 3, auxiliary capacitor patterns are fanned to have an interdigitated structure so that the capacitors are efficiently formed.

Figure 2A:
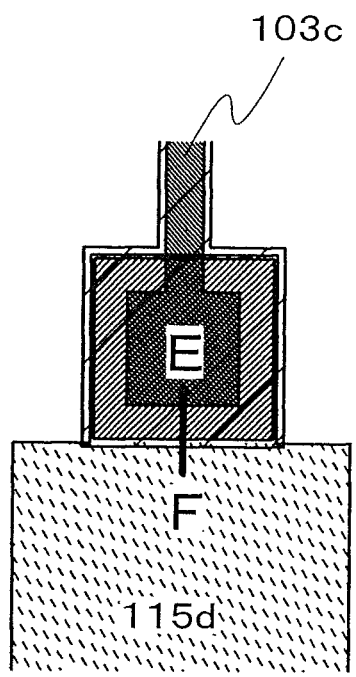
FIGS. 2A and 2B are top views each illustrating a terminal area of the present invention.
Figure 2B:
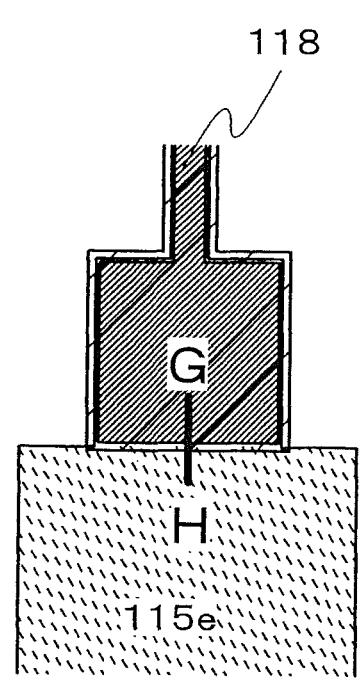

FIGS. 2A and 2B are plan views of an example of a terminal area connected to external circuits, which is formed at the same time as pixel over an active matrix substrate of the present invention.

Examples of structures of terminal area of the active matrix substrate are shown in FIGS. 2A and 2B. FIG. 2A illustrates a case where the electrode 103c serves as a lead wiring over the active matrix substrate. The led electrode 103c formed of the first conductive layer is in contact with the electrode 115d formed of a transparent conductive layer.

Further, a sidewall 113g formed of the second insulating layer 112 is provided at an end portion of the electrode 103c, in a connection portion between the electrode 103c and the electrode 115d, so that the level difference is mitigated. Accordingly, the electrode 115d is prevented from breaking. Further, since the connection portion between the electrode 103c and the electrode 115d is completely covered with the protective insulating layer 123c, it can be protected from contaminants and the like, so that reliability can be improved.

As shown in FIG. 2B, the terminal area has almost the same structure also in the case where the lead wiring is formed of the second conductive layer 118.

Taking FIG. 1, FIGS. 2A and 2B, and FIG. 3 as examples, methods for manufacturing a channel-etch amorphous semiconductor TFT, a storage capacitor element portion, and a connection terminal area using the present invention will be described with reference to FIGS. 4A to 4C, FIGS. 5A to 5C, FIGS. 6A to 6C, FIGS. 7A to 7C, and FIG. 8. FIGS. 4A to 8 shows a cross section taken along line A-B, a cross section taken along line C-D of the plan layout of the pixel portion shown in FIG. 1, a cross section taken along line E-F in FIG. 2A, and a cross section taken along line G-H in FIG. 2B. Note that space between the cross section along line A-B and the cross section taken along C-D, between the cross section taken along C-D and the cross section taken along E-F, and between the cross section taken along E-F and the cross section taken along G-H means omission; the TFT area 10, the capacitor portion 20, and the terminal area 30 which are shown in the figure are formed over one substrate.

In FIG. 4A, a first conductive layer 102 is formed over a substrate 101. A glass substrate which is conventionally used for manufacturing of an amorphous semiconductor TFT may be used for the substrate 101, and alternatively, a quartz substrate, a light-transmitting plastic substrate, or the like may be used. Further, the first conductive layer 102 mainly serves as an electrode or a wiring; a low resistance conductive material such as aluminum (Al) or copper (Cu) is preferably used.

The first conductive layer 102 is required to have low resistance as an electrode or a wiring, and besides, required to have heat resistance to process temperatures in manufacturing of amorphous semiconductor TFTs. Accordingly, a structure in which a heat resistant conductive material and a low resistance conductive material are stacked may be employed. The stack may have a lower layer of a heat resistant conductive material, an intermediate layer of a low resistance conductive material, and an upper layer of a heat resistant conductive material. For example, the first conductive layer 102 may have a layered structure including a lower layer of molybdenum (Mo), an intermediate layer of aluminum (Al), and an upper layer of molybdenum (Mo), and a heat resistant conductive material may be used as a barrier film. As a low resistance conductive material an AgPdCu alloy may be used. As the heat-resistant conductive material, an element selected from titanium (Ti), tantalum (Ta), tungsten (W), molybdenum (Mo), chromium (Cr), and neodymium (Nd), an alloy containing the elements as its component, or a nitride containing the elements as its component may be used. For example, a stack of Ti and Cu and a stack of titanium nitride and Cu can be given. Further, a heat resistant conductive material such as Ti, Cr, Nd, or the like is preferably used in combination, which improves planarity. Moreover, only such heat resistant conductive materials, for example, Mo and W may be combined.

In order to realize a liquid crystal display device, a gate wiring is preferably formed by combining a heat resistant conductive material and a low resistance conductive material. Suitable combinations here will be described.

If screen size is relatively small (around 5-inch), a two-layer structure in which a conductive layer formed of a nitride which is a heat resistant conductive material and a conductive layer formed of a heat resistant conductive material are stacked may be employed. A conductive layer of the upper layer may be formed of an element selected from Al, Cu, Ta, Ti, W, Nd, or Cr; an alloy containing the element as its component; or an alloy film of the above elements in combination; for example, a tantalum nitride film, a tungsten nitride film, a titanium nitride film, or the like may be used. For example, it is preferable that the conductive layer have a two-layer structure in which Cr as the upper layer and Al containing Nd as the lower layer are stacked. The conductive layer of the upper layer has a thickness of 10 nm to 100 nm (preferably 20 nm to 50 nm), the conductive layer of the lower layer has a thickness of 200 nm to 400 nm (preferably, 250 nm to 350 nm).

On the other hand, in the case of use for a large screen, a three-layer structure in which a conductive layer formed of a heat resistant conductive material as a lower layer, a conductive layer formed of a low resistance conductive material as an intermediate layer, and a conductive layer formed of a heat resistant conductive material as an upper layer are stacked is preferably employed.

The conductive layer formed of a low resistance conductive material is formed of a material containing aluminum (Al) as its component; Al containing 0.01 atomic % to 5 atomic % of scandium (Sc), Ti, Nd, silicon (Si), or the like in addition to pure Al is used. The upper layer formed from a heat resistant conductive material has an advantageous effect of preventing hillock generation in the case of using Al for the intermediate layer. The conductive layer formed of a heat resistant conductive material of the lower layer has a thickness of 10 nm to 100 nm (preferably 20 nm to 50 nm), the conductive layer formed of a low resistance conductive material of the intermediate layer has a thickness of 200 nm to 400 nm (preferably 250 nm to 350 nm), and the conductive layer formed of a heat resistant conductive material of an upper layer has a thickness of 10 nm to 100 nm (preferably 20 nm to 50 nm). In this embodiment mode, a conductive layer formed of a heat resistant conductive material of the lower layer is deposited as a Ti film to a thickness of 50 nm by sputtering using Ti as a target; a conductive layer formed of a low resistance conductive material of the intermediate layer is deposited as an Al film to a thickness of 200 nm by sputtering using Al as a target; and a conductive layer formed of a heat resistant material of the upper layer is deposited as a Ti film to a thickness of 50 nm by sputtering using Ti as a target.

Next, using a method such as plasma CVD or sputtering, the first insulating layer 104 is formed over the first conductive layer 102, the first amorphous semiconductor layer 106 is formed over the first insulating layer 104, the second amorphous semiconductor layer containing an impurity element having one conductivity type 108 is formed over the first amorphous semiconductor layer 106. Further, the layers are preferably formed consecutively by plasma CVD or sputtering using a multi-chamber structure or the like without exposing the interfaces between the first insulating layer 104 and the first amorphous semiconductor layer 106, the first amorphous semiconductor layer 106 and the second amorphous semiconductor layer containing an impurity element having one conductivity type 108, and the like to the atmosphere.

The first insulating layer 104 may be an insulating film such as a silicon nitride film, a silicon oxynitride film, or a silicon oxide film, which has a single layer structure or a layered structure, and is formed to a thickness of 50 nm to 600 nm (preferably 300 nm to 500 nm).

The first amorphous semiconductor layer 106 is formed over the first insulating layer 104 to a thickness of 50 nm to 300 nm (preferably 100 nm to 200 nm). As the first amorphous semiconductor layer 106, an amorphous silicon (a-Si) film is formed by a method such as plasma CVD or sputtering using a target of silicon. Alternatively, a microcrystalline semiconductor film, an amorphous silicon germanium ($Si_xGe_{(1-X)}$, ($0<X<1$)) film, or a compound semiconductor film having an amorphous structure, such as an amorphous silicon carbide ($Si_xC_Y$) film can also be applied to the first amorphous semiconductor layer 106.

The second amorphous semiconductor layer containing an impurity element having one conductivity type 108 is formed over the first amorphous semiconductor layer 106 to a thickness of 10 nm to 100 nm. As the second amorphous semiconductor layer containing an impurity element having one conductivity type 108, an amorphous silicon (a-Si) film to which an impurity typified by phosphorus (P), arsenic (As), or boron (B) is added is formed by a method such as plasma CVD or sputtering using a target of silicon. Alternatively, a microcrystalline semiconductor film, an amorphous silicon germanium ($Si_xGe_{(1-X)}$, ($0<X<1$)) film, or a compound semiconductor film having an amorphous structure, such as an amorphous silicon carbide ($Si_xC_Y$) film, to which an impurity typified by phosphorus (P), arsenic (As), or boron (B) is added, can also be applied to the second amorphous semiconductor layer containing an impurity element having one conductivity type 108.

Next, the first conductive layer 102, the first insulating layer 104, the first amorphous semiconductor layer 106, and the second amorphous semiconductor layer containing an impurity element having one conductivity type 108 are patterned by a first photolithography process.

In FIG. 4B, a photoresist is formed over the second amorphous semiconductor layer containing an impurity element having one conductivity type, and is exposed using a first photomask, and development is performed to form first photoresist patterns 110a to 110d. Here, a multi-tone photomask (gray tone mask or half tone mask) is used as the first photomask to form a photoresist pattern having variation in film thickness. The thickness of a portion of the photoresist pattern, where an island-shaped single layer Ruined only of the first conductive layer 102 pattern is formed is set at a first thickness (t1), and the thickness of a portion of the photoresist pattern, where an island-shaped stack formed of the first conductive layer 102, the first insulating layer 104, the first amorphous semiconductor layer 106, and the second amorphous semiconductor layer containing an impurity element having one conductivity type 108 is formed is set at a second thickness (t2). Here, the first thickness of the photoresist pattern is smaller than the second thickness thereof (t1<t2).

In FIG. 4C, the first conductive layer 102, the first insulating layer 104, the first amorphous semiconductor layer 106, and the second amorphous semiconductor layer containing an impurity element having one conductivity type 108 are etched using the first photoresist pattern 110a to 110d as masks. Wet etching or dry etching can be used as an etching method at this time.

In FIG. 5A, the first photoresist patterns 110a to 110d are treated by ashing thereby forming deformed first photoresist patterns 111a to 111c and removing the photoresist pattern 110d. As shown in FIG. 5A, parts of the first photoresist patterns 111a to 111c, which have a thickness corresponding to the first thickness (t1) of the first photoresist patterns 110a to 110c are removed, so that the thickness of the first photoresist patterns 111a to 111c is reduced. In addition, when the first photoresist pattern 110a to 110d are subjected to ashing treatment, the side surfaces of the first photoresist patterns 110a to 110d are also subjected to ashing, the area of the first photoresist patterns 111a to 111c becomes slightly smaller than the area of the photoresist patterns having the second thickness (t2) which are formed in the step of FIG. 4B, and although not shown, an end portion of the second amorphous semiconductor layer containing an impurity element having one conductivity type is to be exposed at the surface.

Using the deformed first photoresist patterns 111a to 111c, in the TFT area 10, a gate insulating layer 105a and the like formed of the first insulating layer 104, an island-shaped first amorphous semiconductor layer 107a and the like formed of the first amorphous semiconductor layer 106, and an island-shaped second amorphous semiconductor layer containing an impurity element having one conductivity type 109a and the like formed of a second amorphous semiconductor layer containing an impurity element having one conductivity type 108 are formed; and in the capacitor portion 20, the capacitor line 103b, the insulating layer 105b, a pattern of the first amorphous semiconductor layer 107b, a pattern of the second amorphous semiconductor layer containing an impurity element having one conductivity type 109b are formed. After that, the photoresist patterns 111a to 111c are removed.

In a first photolithography process, a multi-tone photomask is used as a first photomask to form a gate wiring 103a, a gate insulating layer 105a, an island-shaped first amorphous semiconductor layer 107a, and the island-shaped second amorphous semiconductor layer containing an impurity element having one conductivity type 109a are formed in a TFT area 10. Further, a capacitor line 103b, an insulating layer 105b, the island-shaped first amorphous semiconductor layer 107b, the island-shaped second amorphous semiconductor layer containing an impurity element having one conductivity type 109b are formed in the capacitor portion 20. An electrode 103c is formed in a terminal area 30 (FIGS. 4B and 4C and FIG. 5A).

In FIG. 5B, the second insulating layer 112 is formed over the entire surface of a substrate. The second insulating layer 112 may be an insulating film such as a silicon nitride film, a silicon oxynitride film, or a silicon oxide film, which has a single layer structure or a layered structure, and is formed by a method such as plasma CVD or sputtering. The second insulating layer 112 is used for forming sidewalls on the side surfaces of a pattern of a first conductive layer existing as a single layer and a pattern in which a first conductive layer, a first insulating layer, a first amorphous semiconductor layer, and a second amorphous semiconductor layer containing an impurity element having one conductivity type remain in a stacked island structure, which are formed by an exposure technique using a multi-tone photomask in the first photolithography process. In order to use the second insulating layer 112 as a sidewall, it is important that the second insulating layer 112 has good coverage over a stepped portion. Further, if the side surfaces of the patterns are tapered, unnecessary short easily occurs between a first conductive layer and a second conductive layer even when sidewalls are framed, which would impair reliability of a semiconductor element. Therefore, it is necessary to form the second insulating layer 112 after due consideration of film properties such as coverage and film thickness.

In FIG. 5C, the second insulating layer 112 is etched to form sidewalls 113a to 113g. Highly anisotropic etching treatment is required to be performed by dry etching or the like to form the sidewalls 113a to 113g. Further, when the second insulating layer 112 is subjected to etching, it is required to have sufficient selectivity over the second amorphous semiconductor layer containing an impurity element having one conductivity type 108, and in the case where the island-shaped second amorphous semiconductor layers containing an impurity element having one conductivity type 109a and 109b are slightly etched, it is necessary to set a larger thickness correspondingly in view of the thickness of a film to be etched away.

In FIG. 6A, a second conductive layer 118 is formed over the entire surface of the substrate. The second conductive layer 118 has a structure in which the transparent conductive layer 114 and the metal layer 116 are stacked. As a material of the transparent conductive layer 114, for example, ITO (indium tin oxide) IZO (indium zinc oxide), or the like is used. Further, as a material of the metal layer 116, a high-melting-point metal such as Mo, W, Ti, or Ta, or a low resistance metal such as Al or Cu can be used. However, with respect to the second conductive layer 118, for example, there is a combination like ITO and Al, which promotes corrosion due to oxidation-reduction reaction; therefore, consideration is required and for example, a structure in which a metal having a barrier property is sandwiched in between is employed.

Next, the second conductive layer 118 is patterned by the second photolithography process.

In FIG. 6B, a photoresist is formed over the second conductive layer, and is exposed using a second photomask, and development is performed to form second photoresist patterns 120a to 120e. Here, a multi-tone photomask is used as the second photomask as with the first photomask; thus, a photoresist pattern having variation in thickness is formed. The thickness of a portion of the photoresist pattern, where the second conductive layer 118 which is a stack of the transparent conductive layer 114 and the metal layer 116 remain is set at fourth thickness (t4), and the thickness of a portion of the photoresist pattern, where only the transparent conductive layer 114 is left is set at third thickness (t3). The third thickness (t3) is smaller than the fourth thickness (t4) (t3<t4). The second conductive layer 118 is etched using the second photoresist patterns 120a to 120e as masks. Wet etching or dry etching can be used as an etching method at this time.

In FIG. 6C, the second photoresist patterns 120a to 120e are treated by ashing thereby forming deformed second photoresist patterns 121a to 121e. As shown in FIG. 6C, parts of the deformed second photoresist patterns 121a to 121e, which have a thickness corresponding to the third thickness (t3) of the second photoresist patterns 120a to 120e are removed, so that the thickness of the second photoresist patterns 121a to 121e is reduced, and the metal layer 116 in a part of the second photoresist pattern, whose original thickness is the third thickness (t3) is to be exposed. In addition, when ashing treatment is performed on the second photoresist patterns 120a to 120e, the side surfaces of the second photoresist patterns 120a to 120e are also etched, the area of the deformed second photoresist patterns 121a to 121e becomes slightly smaller than the area of the photoresist patterns having the fourth thickness (t4) which are formed in the step of FIG. 6B.

In FIG. 7A, the metal layer 116 exposed is removed by etching using the deformed second photoresist patterns 121a to 121e as masks to expose the transparent conductive layer 114. Here, etching is performed by a method capable of achieving sufficient selectivity between the metal layer and the transparent conductive layer. The exposed transparent conductive layer 114 is used as a pixel electrode or a connection terminal on the edge of the substrate. Further, a central part of the island-shaped second amorphous semiconductor layer containing an impurity element having one conductivity type 109a is etched to be divided into a source region and a drain region. This etching is performed by anisotropic dry etching. Actually, the island-shaped first amorphous semiconductor layer 107a is also etched in a measure.

In the second photolithography process, a multi-tone photomask is used as the second photomask to form a source wiring 119a formed of a stack of a transparent conductive layer 115a and a metal layer 117a, and a source/drain electrode 119b formed of a transparent conductive layer 115b and a metal layer 117b in the TFT area 10. Further, a part of the transparent conductive layer 115b constitutes a pixel electrode 115f. Still further, an electrode 115c which is a part of the pixel electrode 115f, which opposes the capacitor line 103b is formed in a capacitor portion 20, and electrodes 115d and 115e are formed in a terminal area 30 (FIGS. 6B and 6C and FIG. 7A).

In FIG. 7B, a third insulating layer 122 is formed over the entire surface of the substrate. The third insulating layer 122 may be an insulating film such as a silicon nitride film, a silicon oxynitride film, or a silicon oxide film, which has a single layer structure or a layered structure, and is formed by a method such as plasma CVD or sputtering. The third insulating layer 122 is used as a protective insulating layer for protecting TFTs from impurities and the like.

Next, as a third photolithography process, a photoresist is formed over the third insulating layer 122, and exposure is performed from the rear surface of the substrate 101. Here, the first conductive layer patterned by the first photolithography process and the metal layer patterned by the second photolithography process are used as masks to form third photoresist patterns 124a to 124d. When the third photoresist patterns are formed, since exposure is performed using the first conductive layer 102 and patterns of the metal layer 116 which is the upper layer of the second conductive layer 118 formed over the substrate 101 as masks, photomasks for the third photoresist patterns are rendered unnecessary, and in addition, alignment of photomasks and the substrate 101 also becomes unnecessary.

In FIG. 7C, a reflow process is performed on the third photoresist patterns 124a to 124d formed in FIG. 7B to form deformed third photoresist patterns 125a to 125d. The reflow process increases the area of the third insulating layer 122, which is covered by the resist pattern, and end portions of the deformed third photoresist patterns 125a to 125d extend end portions of the patterns formed of the metal layer 116. There are methods of a reflow process of photoresist, such as a method using heat treatment or a method using an organic solvent, and any of them can be used. Spread of the third photoresist patterns 125a to 125d deformed by a reflow process is determined by properties of the material, the thickness, heating conditions of the photoresist, and in addition, chemistry with a surface of the silicon nitride film which is a base. Therefore, the spread may be controlled using those properties and conditions as appropriate. The spread of the deformed third photoresist patterns 125a to 125d deformed by the reflow process necessarily extends an end portion of a pattern formed of the metal layer 116; however, redundant design ensuring more latitude is desirable.

Figure 8:
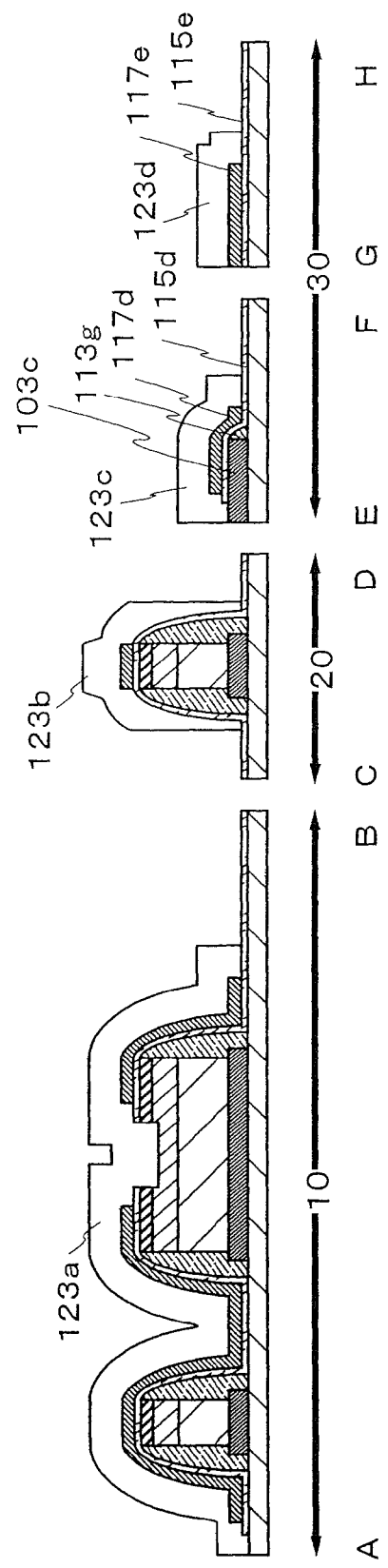
FIG. 8 is a cross-sectional view illustrating a manufacturing process of an active matrix substrate in accordance with the present invention.

In FIG. 8, the third insulating layer 122 is patterned using the deformed third photoresist patterns 125a to 125d as masks to form protective insulating layers 123a to 123d. After that, the deformed third photoresist patterns are removed. The protective insulating layers suppress entry of contaminants from an alignment layer or liquid crystal over the glass substrate or the protective insulating layer into amorphous semiconductor TFTs or metal wirings. Further, since resist is not formed by back exposure in a portion where only patterns of the transparent conductive layer exists, a structure in which the protective insulating layer is not formed and the conductive layer is exposed is obtained.

In the third photolithography process, a back exposure technique is used to form protective insulating layers 123a to 123d (FIGS. 7B and 7C and FIG. 8)

In accordance with this embodiment mode, an active matrix substrate can be manufactured by three photolithography processes using two photomasks. Accordingly, as compared with an amorphous semiconductor TFT conventionally manufactured by at least four times of photolithography processes using four photomasks, the number of photomasks and the number of photolithography processes can be significantly reduced, and time of manufacture and manufacturing cost can be reduced.

Further, sidewalls are formed on side surfaces of semiconductor elements manufactured in this embodiment mode; therefore, the first conductive layer and the second conductive layer can be prevented from unnecessarily shorting to each other, and step coverage over end portions of each pattern is improved, which compensates for poor coverage of wirings, electrodes, and insulating layers; thus, reliability and yield of a semiconductor device can be improved. Further, since it is not necessary to elaborating end portions of the insulating layer of the first conductive layer into strict tapered shape, reduction in load of a manufacturing process of a semiconductor device can be expected.

Further, with respect to TFTs manufactured in accordance with this embodiment mode, a first conductive layer, a first insulating layer over the first conductive layer, a first amorphous semiconductor layer over the first insulating layer, and a second amorphous semiconductor layer containing an impurity element having one conductivity type over the first amorphous semiconductor layer are patterned using a multi-tone photomask, which prevents the patterned first and second amorphous semiconductor layer from extending out of the first conductive layer; thus, a structure in which the first conductive layer shields the first amorphous semiconductor layer and the second amorphous semiconductor layer containing an impurity element having one conductivity type from light is obtained, and thereby photo leakage current generated when light is incident on the semiconductor layer.

Further, as for a TFT manufactured in accordance with this embodiment mode, at the time of forming a source region and a drain region, a step of etching parts of the second conductive layer, the second amorphous semiconductor layer containing impurity element having one conductivity type, and the first amorphous semiconductor layer using a multi-tone photomask, and a step after deforming the multi-tone mask of etching the metal layer of the second conductive layer, are performed so that a first level difference occurs between the first amorphous semiconductor layer and a transparent conductive layer of the second conductive layer, and a second level difference occurs between a transparent conductive film of the second conductive layer and the second metal layer. Accordingly, an end portion of a lower layer extends from an upper layer to be exposed, and thus, coverage of the third insulating layer over the channel region can be improved. Further, a channel formation portion of the TFT is covered by sidewalls and the first insulating layer, so that deterioration in the characteristics of a semiconductor element due to impurity contamination into a channel formation portion from the external such as a substrate or a liquid crystal layer is reduced; thus, reliability can be improved.

Further, in a capacitor element manufactured in accordance with this embodiment mode, parts of a capacitor line and a pixel electrode serve as opposite electrodes of the storage capacitor element, and a first insulating layer and a sidewall between them serve as dielectrics in the storage capacitor element; thus, capacitors can be provided on side surfaces of the capacitor line. The thickness of the sidewalls can be made thinner than that of the sidewalls of a portion where the first insulating layer serves as a dielectric; therefore, capacitors can be efficiently formed on the surfaces of the capacitor line, and the capacitors can be formed three-dimensionally on not only the top face of the capacitor line but also the side surfaces thereof; thus, the area of a storage capacitor element per one pixel can be made smaller than conventional.

A source/drain electrode and a source/drain electrode wiring which are manufactured in accordance with the present invention are formed using a second conductive layer having a layered structure of a transparent conductive layer and a metal layer. Thus, a region where contact holes for a drain electrode and a pixel electrode, which is conventionally in a pixel portion is not required; therefore, aperture ratio can be improved. Further, with such a structure that a pixel electrode is in contact with a substrate and is not stacked with an insulating film, aperture ratio and transmittance of pixels are improved.

Embodiment Mode 2

Figure 9:
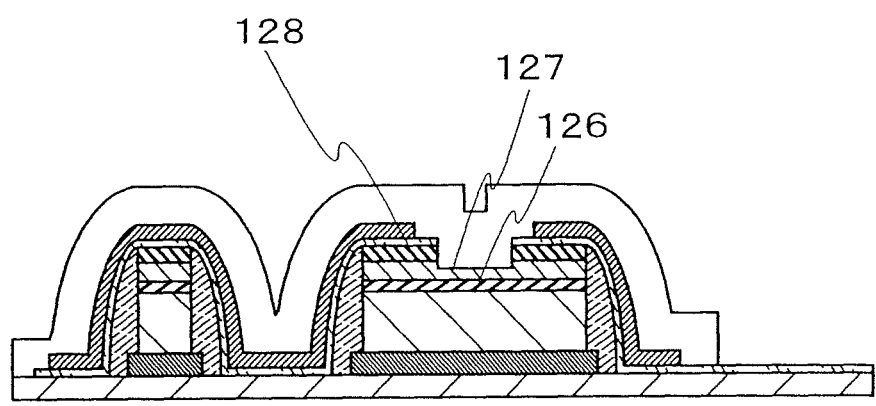
FIG. 9 is a cross-sectional view illustrating an active matrix substrate of the present invention.

In Embodiment Mode 1, a TFT using an amorphous semiconductor layer is described; however, in this embodiment mode, an example of a TFT using a microcrystalline semiconductor layer will be described. A schematic diagram of a TFT using a microcrystalline semiconductor is shown in FIG. 9. In this embodiment mode, a stack of a first microcrystalline semiconductor layer 126 and a first amorphous semiconductor layer 127 is used instead of the first amorphous semiconductor layer 106 in Embodiment Mode 1.

The first microcrystalline semiconductor layer 126 serves as a channel. This first microcrystalline semiconductor layer 126 can be formed by high frequency plasma CVD with a frequency of several tens of MHz to several hundreds of MHz or by microwave plasma CVD with a frequency of 1 GHz or more. Typically, the microcrystalline semiconductor layer can be formed using silicon hydride such as $SiH_4$ or $Si_2H_6$ which is diluted with hydrogen. Further, the microcrystalline semiconductor film can be formed by dilution with one or more of rare gas elements selected from helium, argon, krypton, and neon in addition to silicon hydride and hydrogen. The flow rate ratio of hydrogen to silicon hydride at this time is set to be 5:1 to 200:1, preferably, 50:1 to 150:1, more preferably, 100:1. Note that $SiH_2Cl_2$, $SiHCl_3$, $SiCl_4$, $SiF_4$, or the like can be used instead of silicon hydride. Further, the first amorphous semiconductor layer 127 may use the first amorphous semiconductor layer 106 shown in Embodiment Mode 1. The first amorphous semiconductor layer 127 functions as a buffer layer, for example, it reduces OFF-state current of a TFT, prevents the first microcrystalline semiconductor layer 126 from being oxidized, and prevents the first microcrystalline semiconductor layer from being etched in etching for forming a source region and a drain region.

Further, a microcrystalline semiconductor layer containing impurity element having one conductivity type 128 can be used instead of the second amorphous semiconductor layer containing an impurity element having one conductivity type 108 in Embodiment Mode 1. Since parasitic resistance between a channel and source and drain electrodes can be reduced, improvement in ON current can be realized.

Embodiment Mode 3

Figure 10:
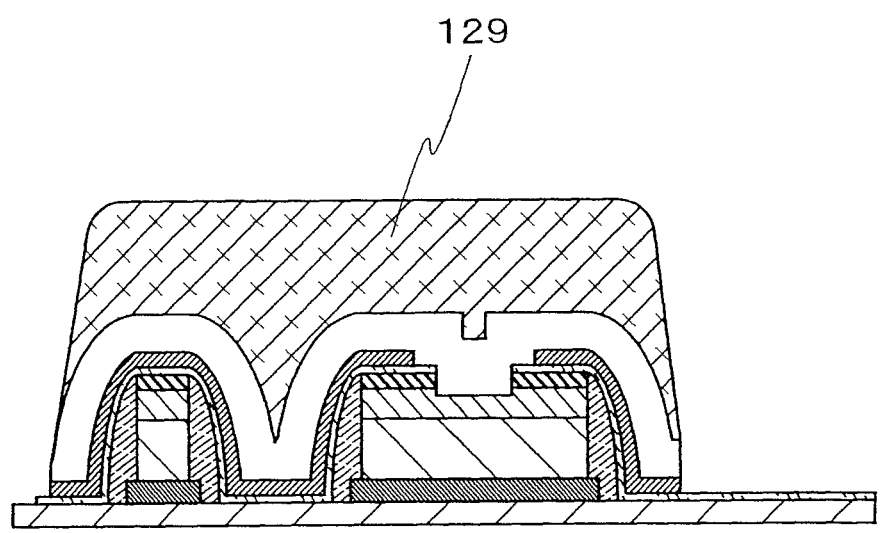
FIG. 10 is a cross-sectional view illustrating an active matrix substrate of the present invention.

In this embodiment mode, an example of using a positive photosensitive resin is used instead of the third photoresist patterns 124a to 124d in the third photolithography process of Embodiment Mode 1 will be described. A schematic diagram of a TFT using the positive photosensitive resin is shown in FIG. 10.

In the third photolithography process in Embodiment Mode 1, a positive photosensitive material is formed, and exposure is performed from the rear surface of the substrate 101. Using the fact that a portion corresponding to the first conductive layer patterned by first photolithography process and the metal layer patterned by second photolithography process in Embodiment Mode 1 is shielded from light, a positive photosensitive material pattern 129 is formed. At the time of forming the positive photosensitive material pattern 129, using the first conductive layer and the metal layer which are formed over the substrate 101 as masks, exposure is performed from the rear surface; therefore, a photomask for forming a positive photosensitive material pattern is rendered unnecessary, and in addition, alignment of a photomask and the substrate 101 also becomes unnecessary.

The third insulating layer 122 is patterned using the positive photosensitive material pattern 129 as a mask to form the protective insulating layers 123a to 123d. The protective insulating layers suppress entry of contaminants from an alignment layer or liquid crystal over the glass substrate or the protective insulating layer into amorphous semiconductor TFTs or metal wirings. Further, since a positive photosensitive material pattern is not formed by back exposure in a portion where only patterns of the transparent conductive layer exists, a structure in which the protective insulating layer is not formed and the conductive layer is exposed is obtained.

As the positive photosensitive material, positive photosensitive siloxane, a positive photosensitive acrylic resin, or a positive photosensitive polyimide resin, or the like can be used. Further, if a positive photosensitive resin for black matrix is used, the positive photosensitive material pattern serves as black matrix.

Thus, when the positive photosensitive material pattern 129 is used instead of the third photoresist patterns 124a to 124d described in Embodiment Mode 1, the step of removing a resist in the third photolithography process can be omitted, which can further simplifies the process.

Embodiment Mode 4

Figure 11:
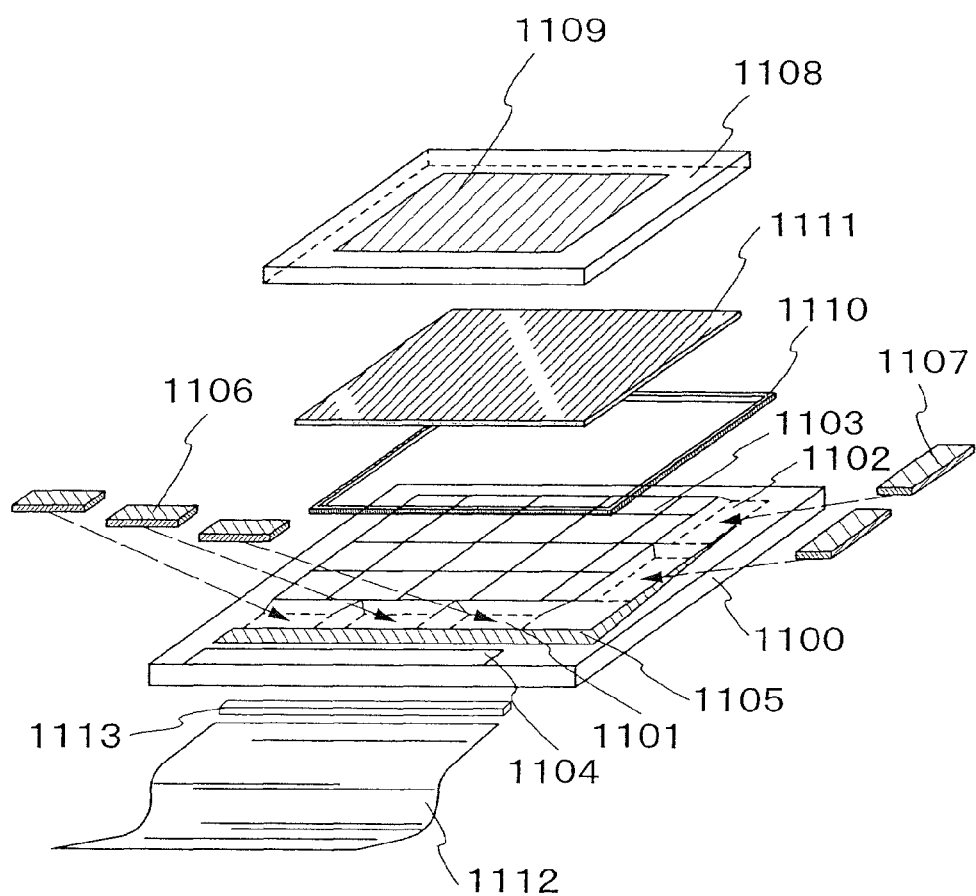
FIG. 11 is a diagram illustrating mounting of a liquid crystal display device.

FIG. 11 is a diagram schematically illustrating a manner of assembling an electro-optic device using a COG (chip on glass) method. A pixel portion 1103, an external input-output terminal 1104, and a connection wiring 1105 are formed on a first substrate 1100. Regions surrounded by dotted lines are an IC chip bonding region 1101 on the scan line side and an IC chip bonding region 1102 on the data line side. A counter electrode 1109 is formed on a second substrate 1108, and is bonded to the first substrate 1100 with a sealing material 1110. Liquid crystal is enclosed inside the sealing material 1110 to form a liquid crystal layer 1111. The first substrate 1100 and the second substrate 1108 are bonded with a predetermined gap therebetween, for example, 3 μm to 8 μm in the case of nematic liquid crystal, and 1 μm to 4 μm in the case of smectic liquid crystal.

IC chips 1106 and 1107 have different structure as provided on the data line side and the scan line side. The IC chips are mounted on the first substrate 1100. An FPC 1112 (flexible printed wiring board: flexible printed circuit) for inputting power supply and control signals from the external is bonded to the external input-output terminal 1104. A reinforcement board 1113 may be provided to increase adhesive strength on the FPC 1112. Thus, the electro-optic device can be completed. In the case where electrical inspection is performed on the IC chips before being mounted on the first substrate 1100, yield at the final step of the electro-optic device can be improved, and further, reliability can be increased.

Figure 12A:
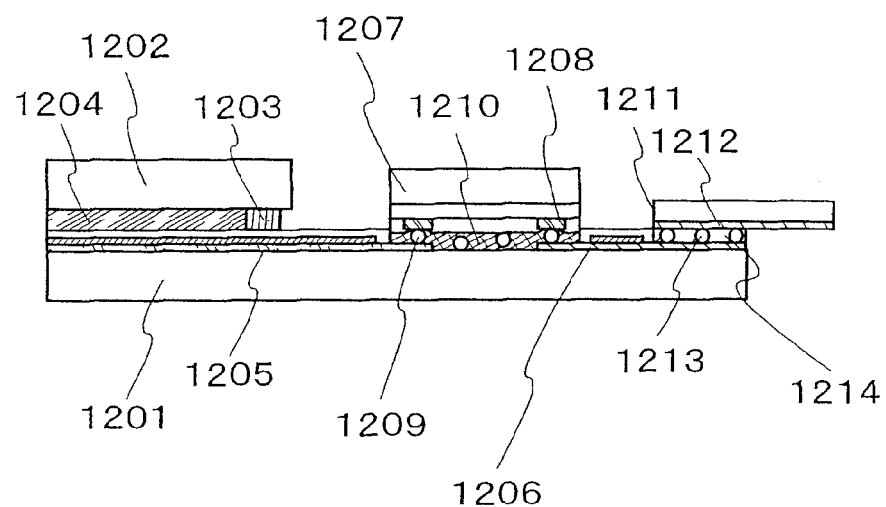
FIGS. 12A and 12B are diagrams each illustrating mounting of a liquid crystal display device.
Figure 12B:
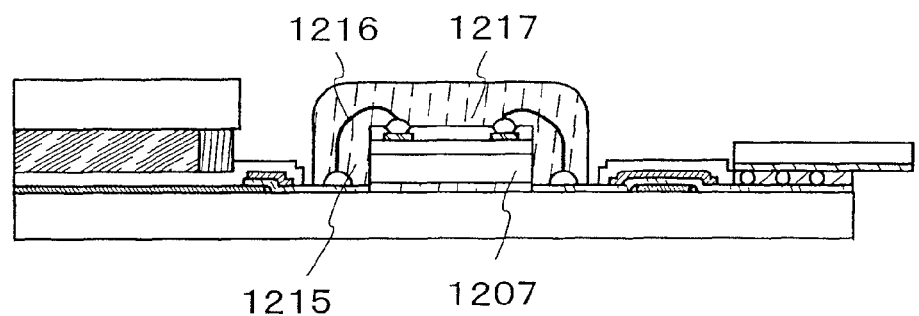

Further, the IC chips can be mounted on the first substrate by employing a connection method using an anisotropic conductive material, a wire bonding method, or the like. Examples are illustrated in FIGS. 12A and 12B. FIG. 12A illustrates an example of mounting an IC chip 1207 on a first substrate 1201 with an anisotropic conductive member. A pixel portion, a lead line 1205 electrically connected to the pixel portion, a connection wiring and an input-output terminal 1206 are provided over the first substrate 1201. A second substrate 1202 is bonded to the first substrate 1201 with a sealing material 1203, and a liquid crystal layer 1204 is provided therebetween.

Further, an FPC 1211 is bonded to one of ends of the connection wiring and input-output terminal 1206 with an anisotropic conductive member. The anisotropic conductive member includes a resin 1214 and conductive particles 1213 having a diameter of several tens to several hundreds of μm, whose surfaces are plated with Au or the like, and the connection wiring and the input-output terminal 1206 are electrically connected to the wiring 1212 formed on the FPC 1211 with the conductive particles 1213. The IC chip 1207 is also bonded to the first substrate with the anisotropic conductive member, and is electrically connected to an input-output terminal 1208 provided on the IC chip 1207 and the lead line 1205 or the connection wiring and the input-output terminal 1206 with conductive particles 1209 mixed in the resin 1210. As a structure of the lead line 1205 and the connection wiring and the input-output terminal 1206, the structure shown in a cross section taken along line G-H in FIG. 8 may be used. FIG. 12A illustrates an example of using a stack of the electrode 115e which is a transparent conductive layer and a metal layer 117e for the lead line 1205 and the connection wiring and the input-output terminal 1206.

Further, as shown in FIG. 12B, an IC chip is fixed to the first substrate with an adhesive member 1215, and an input-output terminal of the IC chip may be connected to the lead line or the connection wiring and input-output terminal with an Au wire 1216. Then, the IC chip is enclosed with a resin 1217. A structure shown in a cross section taken along line E-F in FIG. 8 may be used, and FIG. 12B illustrates an example of using a stack of the electrode 103c formed of the first conductive layer and the electrode 115d formed of a transparent conductive layer electrically connected to the electrode 103c, and metal layer 117d for the lead line 1205 and the connection wiring and the input-output terminal 1206.

A mounting method of the IC chip is not limited to the method based on FIG. 11 and FIGS. 12A and 12B, and a COG method, a wire bonding method, or a TAB (tape automated bonding) method can be used other than the method described here.

This embodiment mode can be freely combined with any of Embodiment Modes 1 to 3.

Embodiment Mode 5

Semiconductor devices and electronic devices according to the present invention include a liquid crystal TV, a camera such as a video camera or a digital camera, a goggle-type display (a head mounted display), a navigation system, a sound reproduction system (such as a car audio system, audio components), a laptop personal computer, a game machine, a personal digital assistant (such as a mobile computer, a cellular phone, a portable game machine, or an electronic book), and an image reproduction system provided with a recording medium (specifically, a system provided with a display that can reproduce content of a recording medium such as a Digital Versatile Disc (DVD) and display the image; for example, a portable DVD player). Some specific examples of electronic products among the electronic devices are shown in FIGS. 13A to 13D and FIG. 14.

Figure 13A:
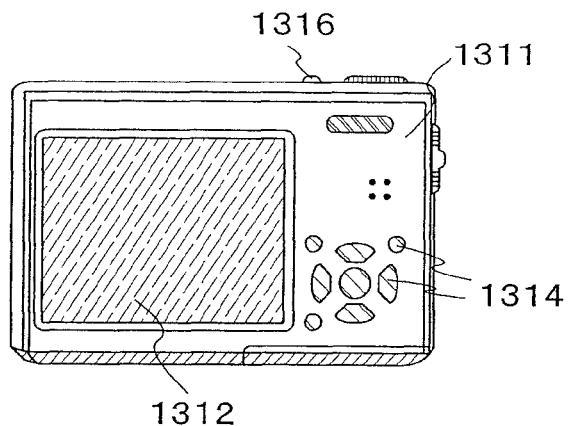
FIGS. 13A to 13D are diagrams illustrating examples of electronic devices of the present invention.

FIG. 13A illustrates a digital camera, which includes a main body 1311, a display portion 1312, an imaging portion, operation keys 1314, a shutter button 1316, and the like. Note that FIG. 13A is a view from the display portion 1312 side and the imaging portion is not shown. The present invention makes it possible to realize a highly reliable digital camera having a lower cost display portion.

Figure 13B:
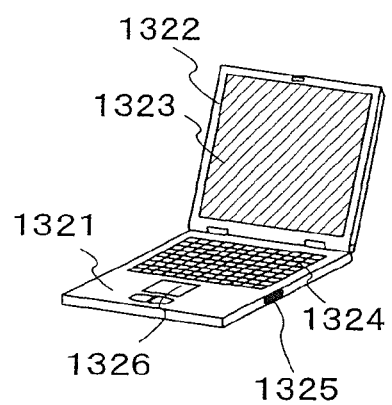

FIG. 13B illustrates a notebook personal computer, which includes a main body 1321, a chassis 1322, a display portion 1323, a keyboard 1324, an external connection port 1325, a pointing device 1326, and the like. The present invention makes it possible to realize a highly reliable notebook personal computer having a lower cost display portion.

Figure 13C:
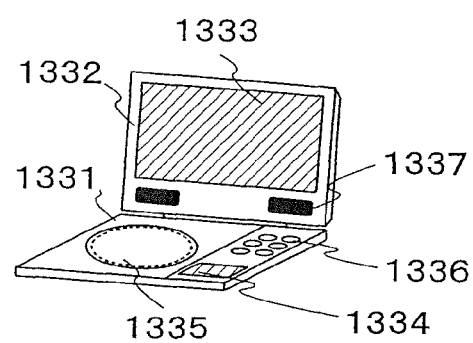

FIG. 13C illustrates a portable image reproducing device provided with a recording medium (specifically, a DVD reproducing device), which includes a main body 1331, a chassis 1332, a first display portion 1333, a second display portion 1334, a recording medium (DVD or the like) reading portion 1335, operation keys 1336, a speaker portion 1337, and the like. The first display portion 1333 mainly displays image information and the second display portion 1334 mainly displays text information. In addition, the image reproducing device provided with a recording medium further includes a home video game machine and the like. The present invention makes it possible to realize a highly reliable image reproducing device having a lower cost display portion.

Figure 13D:
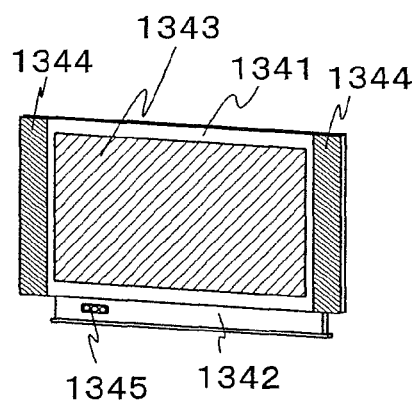

FIG. 13D illustrates a television set (hereinafter, referred to in an abbreviated form of "TV"), which includes a chassis 1341, a supporting 1342, a display portion 1343, speakers 1344, a video input terminal 1345, and the like. This TV is manufactured using thin film transistors formed in accordance with the manufacturing method in the embodiment modes described above for the display portion 1343 and a driver circuit. Note that a TV includes a liquid crystal TV, an organic EL TV, and the like in its category. The present invention makes it possible to realize a highly reliable TV having a lower cost display portion, in particular, a large TV having a large screen of 22 inches to 50 inches in particular.

Figure 14:
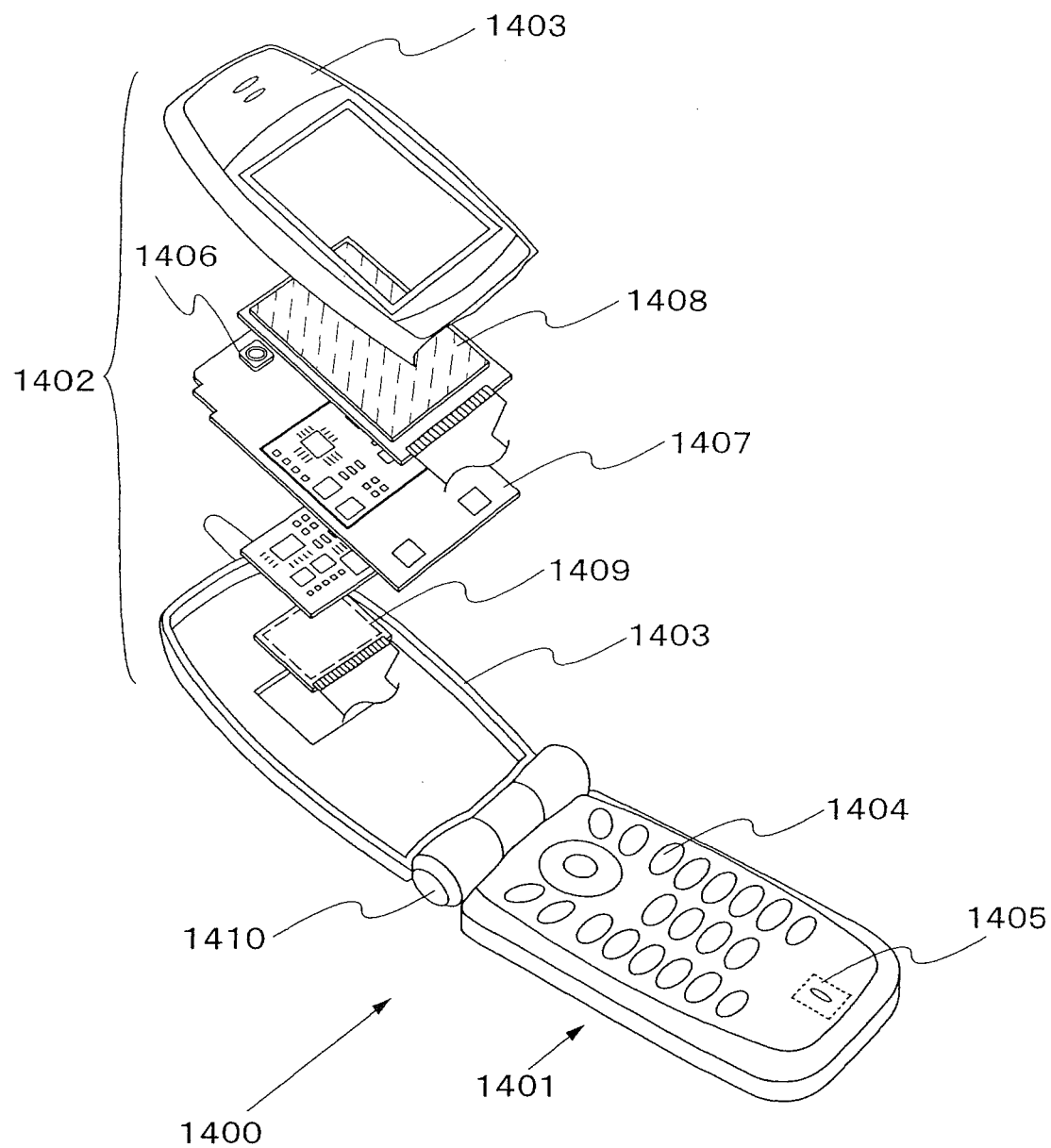
FIG. 14 is a diagram illustrating an example of an electronic device.

Further, a cellular phone shown in FIG. 14 includes a main body (A) 1401 provided with operation switches 1404, a microphone 1405 and the like, and a main body (B) 1402 provided with a display panel (A) 1408, a display panel (B) 1409, a speaker 1406 and the like, which are connected with a hinge 1410 so that the cellular phone can be opened or folded. The display panel (A) 1408 and the display panel (B) 1409 are incorporated in a chassis 1403 in the main body (B) 1402 together with a circuit board 1407. Pixel portions of the display panel (A) 1408 and the display panel (B) 1409 are placed to be visible from an open window formed in the chassis 1403.

As for the display panel (A) 1408 and the display panel (B) 1409, specifications such as the number of pixels can be appropriately set in accordance with functions of the cellular phone 1400. For example, the display panel (A) 1408 and the display panel (B) 1409 can be used in combination so as to be used as a main display screen and a sub-display, screen respectively.

The present invention makes it possible to realize a highly reliable portable information terminal having a lower cost display portion.

The cellular phone according to this embodiment mode can be changed into various modes depending on the functions and applications thereof. For example, a cellular phone with camera may be manufactured by implementing an imaging element in the hinge 1410 part. Further, when the operation switches 1404, the display panel (A) 1408, and the display panel (B) 1409 are incorporated in one chassis, the above-described effect can be obtained. Further, similar effects can be obtained even when the structure of this embodiment mode is applied to an information display terminal provided with a plurality of display portions.

As described above, by carrying out the present invention, that is, by employing any one of manufacturing methods or structures in Embodiment Modes 1 to 4, various electronic devices can be completed.

This application is based on Japanese Patent Application serial No. 2007-275612 filed with Japan Patent Office on Oct. 23, 2007, the entire contents of which are hereby incorporated by reference.

What is claimed is:

1. A method for manufacturing a semiconductor device comprising the steps of:
   forming a first conductive layer over a substrate;
   forming a first insulating layer over the first conductive layer;
   forming a first semiconductor layer over the first insulating layer;
   forming a second semiconductor layer containing an impurity element having one conductivity type over the first semiconductor layer;
   forming a first resist pattern over the second semiconductor layer;
   processing the first conductive layer, the first insulating layer, the first semiconductor layer, and the second semiconductor layer, using the first resist pattern as a mask, thereby forming an island-shaped stack including the first conductive layer, the first insulating layer, the first semiconductor layer, and the second semiconductor layer;
   forming a second insulating layer over the substrate and the island-shaped stack;
   processing the second insulating layer, thereby forming a sidewall in contact with side surfaces of the first conductive layer, the first insulating layer, the first semiconductor layer, and the second semiconductor layer;
   forming a second conductive layer including a stack of a transparent conductive layer and a metal layer over the substrate, the island-shaped stack, and the sidewall;
   forming a second resist pattern having a first thickness and a second thickness over the second conductive layer;
   processing the second semiconductor layer and the metal layer using the second resist pattern as a mask, thereby forming a source region and a drain region, and a pixel electrode formed of the transparent conductive layer;
   forming a third insulating layer over the metal layer, the transparent conductive layer, and the first semiconductor layer;
   forming a third resist pattern over the third insulating layer; and
   processing the third insulating layer using the third resist pattern as a mask, thereby exposing a part of the transparent conductive layer,
   wherein the second insulating layer includes a single layer structure or a stacked structure selected from a silicon nitride film, a silicon oxynitride film, and/or a silicon oxide film.

2. The method for manufacturing a semiconductor device according to claim 1, wherein the first semiconductor layer and the second semiconductor layer are amorphous semiconductor layers.

3. The method for manufacturing a semiconductor device according to claim 1, wherein the first semiconductor layer or the second semiconductor layer has at least a microcrystalline semiconductor layer.

4. The method for manufacturing a semiconductor device according to claim 1, wherein the semiconductor device is one selected from the group consisting of a digital camera, a personal computer, a portable DVD player, a television, and a cellular phone.

5. The method for manufacturing a semiconductor device according to claim 1, wherein the second resist pattern is formed using a multi-tone photomask.

6. The method for manufacturing a semiconductor device according to claim 1, wherein the third resist pattern is formed by back exposure using the first conductive layer and the metal layer as masks.

7. A method for manufacturing a semiconductor device comprising the steps of:
   forming a first conductive layer over a substrate;
   forming a first insulating layer over the first conductive layer;
   forming a first semiconductor layer over the first insulating layer;

forming a second semiconductor layer containing an impurity element having one conductivity type over the first semiconductor layer;

forming a first resist pattern over the second semiconductor layer;

processing the first conductive layer, the first insulating layer, the first semiconductor layer, and the second semiconductor layer, using the first resist pattern as a mask, and ashing the first resist pattern so that an end portion of the second semiconductor layer is exposed, thereby forming an island-shaped stack including the first conductive layer, the first insulating layer, the first semiconductor layer, and the second semiconductor layer;

forming a second insulating layer over the substrate and the island-shaped stack;

processing the second insulating layer, thereby forming a sidewall in contact with side surfaces of the first conductive layer, the first insulating layer, the first semiconductor layer, and the second semiconductor layer;

forming a second conductive layer including a stack of a transparent conductive layer and a metal layer over the substrate, the island-shaped stack, and the sidewall;

forming a second resist pattern having a first thickness and a second thickness over the second conductive layer;

processing the second semiconductor layer and the metal layer using the second resist pattern as a mask, thereby forming a source region and a drain region, and a pixel electrode formed of the transparent conductive layer;

forming a third insulating layer over the metal layer, the transparent conductive layer, and the first semiconductor layer;

forming a third resist pattern over the third insulating layer; and processing the third insulating layer using the third resist pattern as a mask, thereby exposing a part of the transparent conductive layer, wherein the second insulating layer includes a single layer structure or a stacked structure selected from a silicon nitride film, a silicon oxynitride film, and/or a silicon oxide film.

8. The method for manufacturing a semiconductor device according to claim 7, wherein the first semiconductor layer and the second semiconductor layer are amorphous semiconductor layers.

9. The method for manufacturing a semiconductor device according to claim 7, wherein the first semiconductor layer or the second semiconductor layer has at least a microcrystalline semiconductor layer.

10. The method for manufacturing a semiconductor device according to claim 7, wherein the semiconductor device is one selected from the group consisting of a digital camera, a personal computer, a portable DVD player, a television, and a cellular phone.

11. The method for manufacturing a semiconductor device according to claim 7, wherein the second resist pattern is formed using a multi-tone photomask.

12. The method for manufacturing a semiconductor device according to claim 7, wherein the third resist pattern is formed by back exposure using the first conductive layer and the metal layer as masks.

13. A method for manufacturing a semiconductor device comprising the steps of:

forming a first conductive layer over a substrate;

forming a first insulating layer over the first conductive layer;

forming a first semiconductor layer over the first insulating layer;

forming a second semiconductor layer containing an impurity element having one conductivity type over the first semiconductor layer;

forming a first resist pattern having a first thickness and a second thickness over the second semiconductor layer;

processing the first conductive layer, the first insulating layer, the first semiconductor layer, and the second semiconductor layer, using the first resist pattern as a mask, thereby forming an island-shaped single layer having the first conductive layer, and an island-shaped stack including the first conductive layer, the first insulating layer, the first semiconductor layer, and the second semiconductor layer;

forming a second insulating layer over the substrate, the island-shaped single layer, and the island-shaped stack;

processing the second insulating layer, thereby forming a sidewall in contact with side surfaces of the island-shaped single layer, the first conductive layer, the first insulating layer, the first semiconductor layer, and the second semiconductor layer;

forming a second conductive layer including a stack of a transparent conductive layer and a metal layer over the substrate, the island-shaped single layer, the island-shaped stack, and the sidewall;

forming a second resist pattern having a third thickness and a fourth thickness over the second conductive layer;

processing the second semiconductor layer and the metal layer using the second resist pattern as a mask, thereby forming a source region and a drain region, a pixel electrode formed of the transparent conductive layer, and a connection terminal;

forming a third insulating layer over the metal layer, the transparent conductive layer, the first semiconductor layer, and the first conductive layer;

forming a third resist pattern over the third insulating layer; and processing the third insulating layer using the third resist pattern as a mask, thereby exposing a part of the transparent conductive layer, wherein the second insulating layer includes a single layer structure or a stacked structure selected from a silicon nitride film, a silicon oxynitride film, and/or a silicon oxide film.

14. The method for manufacturing a semiconductor device according to claim 13, wherein the first semiconductor layer and the second semiconductor layer are amorphous semiconductor layers.

15. The method for manufacturing a semiconductor device according to claim 13, wherein the first semiconductor layer or the second semiconductor layer has at least a microcrystalline semiconductor layer.

16. The method for manufacturing a semiconductor device according to claim 13, wherein the semiconductor device is one selected from the group consisting of a digital camera, a personal computer, a portable DVD player, a television, and a cellular phone.

17. The method for manufacturing a semiconductor device according to claim 13, wherein the first resist pattern and the second resist pattern are formed using multi-tone photomasks.

18. The method for manufacturing a semiconductor device according to claim 13, wherein the third resist pattern is formed by back exposure using the first conductive layer and the metal layer as masks.

* * * * *